(12) United States Patent
Mun

(10) Patent No.: US 11,410,733 B2
(45) Date of Patent: Aug. 9, 2022

(54) MEMORY DEVICE AND OPERATING METHOD THEREOF

(71) Applicant: SK hynix Inc., Gyeonggi-do (KR)

(72) Inventor: Yeong Jo Mun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/201,139

(22) Filed: Mar. 15, 2021

(65) Prior Publication Data
US 2022/0084597 A1 Mar. 17, 2022

(30) Foreign Application Priority Data
Sep. 16, 2020 (KR) .................. 10-2020-0118695

(51) Int. Cl.
| | | |
|---|---|---|
| G11C 16/14 | (2006.01) | |
| G11C 16/10 | (2006.01) | |
| G11C 16/04 | (2006.01) | |
| G11C 16/08 | (2006.01) | |
| G11C 16/34 | (2006.01) | |
| G11C 16/26 | (2006.01) | |
| G11C 16/32 | (2006.01) | |
| G11C 16/24 | (2006.01) | |

(52) U.S. Cl.
CPC .......... *G11C 16/10* (2013.01); *G11C 16/0483* (2013.01); *G11C 16/08* (2013.01); *G11C 16/24* (2013.01); *G11C 16/26* (2013.01); *G11C 16/32* (2013.01); *G11C 16/3459* (2013.01)

(58) Field of Classification Search
CPC ..... G11C 16/10; G11C 16/0483; G11C 16/08; G11C 16/24; G11C 16/26; G11C 16/32; G11C 16/3459
See application file for complete search history.

(56) References Cited

U.S. PATENT DOCUMENTS

| | | | | |
|---|---|---|---|---|
| 2018/0075909 A1* | 3/2018 | Lee | .................... | G11C 16/3459 |
| 2021/0158871 A1* | 5/2021 | Shin | ...................... | G11C 16/30 |
| 2021/0210146 A1* | 7/2021 | Lee | ......................... | G11C 16/20 |
| 2021/0327513 A1* | 10/2021 | Hwang | .................. | G11C 16/30 |
| 2022/0068388 A1* | 3/2022 | Shin | .................... | G11C 16/0483 |

FOREIGN PATENT DOCUMENTS

| | | |
|---|---|---|
| KR | 10-2015-0020430 | 2/2015 |
| KR | 10-1925018 | 12/2018 |

\* cited by examiner

*Primary Examiner* — Hien N Nguyen
(74) *Attorney, Agent, or Firm* — IP & T Group LLP

(57) ABSTRACT

An electronic device is provided. A memory device controls a signal for setting a voltage level of a bit line. The memory device includes a plurality of memory cells, a peripheral circuit configured to perform a plurality of program loops for programming selected memory cells among the plurality of memory cells, and a sense signal controller configured to determine, during a program operation on a first memory cell among the selected memory cells, a bit line set-up time of a bit line coupled to the first memory cell based on at least one of a state of second memory cells adjacent to the first memory cell and a number of program loops performed on the first memory cell, the first memory cell having a threshold voltage higher than a pre-verify voltage and lower than a main verify voltage.

20 Claims, 19 Drawing Sheets

FIG. 16A

| NUMBER OF FIRST PROGRAM PERMISSION MEMORY CELLS (PGM_NUM) | PGM_NUM < N11 | N11 ≤ PGM_NUM < N12 | PGM_NUM ≥ N12 |
|---|---|---|---|
| t_OFFSET1 | – | t12 | t13 |
| t_DPGM_SETUP | tREF | tREF+t12 | tREF+t13 |

FIG. 16B

| PGMLOOP_NUM | PGMLOOP_NUM < N21 | N21 ≤ PGMLOOP_NUM < N22 | PGMLOOP_NUM ≥ N22 |
|---|---|---|---|
| t_OFFSET2 | t21 | t22 | – |
| t_DPGM_SETUP | tREF+t21 | tREF+t22 | tREF |

FIG. 16C

| | N11 ≤ PGM_NUM < N12<br>PGMLOOP_NUM < N21 |
|---|---|
| t_DPGM_SETUP | tREF+t12+t21 |

MEMORY DEVICE AND OPERATING METHOD THEREOF

CROSS-REFERENCE TO RELATED APPLICATION

The present application claims priority under 35 U.S.C. § 119(a) to Korean patent application number 10-2020-0118695, filed on Sep. 16, 2020 with the Korean Intellectual Property Office, and which is incorporated herein by reference in its entirety.

BACKGROUND

Field of Invention

Various embodiments of the present disclosure generally relate to an electronic device, and more particularly, to a memory device and an operating method thereof.

Description of Related Art

A storage device may store data in response to control of a host device such as a computer, smartphone, or smartpad. Examples of a storage device include a device for storing data in a magnetic disk, such as a hard disk drive (HDD), and a device for storing data in a semiconductor memory, especially in a nonvolatile memory, such as a solid state drive (SSD) or a memory card.

A storage device may include a memory device storing data and a memory controller controlling the memory device. Generally, there are two types of memory devices: volatile memory devices and nonvolatile memory devices. Examples of nonvolatile memory devices include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), and Ferroelectric RAM (FRAM).

SUMMARY

Various embodiments of the present disclosure are directed to a memory device controlling a signal for setting a voltage level of a bit line, which is coupled to a memory cell on which a double verify program operation is performed, to a target level during the double verify program operation and a method of operating the memory device.

According to an embodiment, a memory device may include a plurality of memory cells, a peripheral circuit configured to perform a plurality of program loops for programming selected memory cells among the plurality of memory cells and a sense signal controller configured to determine, during a program operation on a first memory cell among the selected memory cells, a bit line set-up time of a bit line coupled to the first memory cell based on at least one of a state of second memory cells adjacent to the first memory cell and a number of program loops performed on the first memory cell, the first memory cell having a threshold voltage higher than a pre-verify voltage and lower than a main verify voltage.

According to an embodiment, a method of operating a memory device including a plurality of memory cells may include performing a plurality of program loops for programming selected memory cells among the plurality of memory cells, and determining a bit line set-up time of a bit line coupled to a first memory cell, among the selected memory cells, during a program operation on the first memory cell, based on at least one of a state of second memory cells adjacent to the first memory cell and a number of program loops performed on the first memory cell, the first memory cell having a threshold voltage higher than a pre-verify voltage and lower than a main verify voltage.

According to an embodiment, a memory device may a plurality of memory cells arranged at intersections of a plurality of word lines extending in one direction and a plurality of bit lines extending in another direction, a voltage generator coupled to the plurality of word lines, and control logic configured to perform a program operation, including a plurality of program loops, on a target memory cell coupled to a target bit line and a word line to which memory cells adjacent to the target memory cell are also coupled, each adjacent memory cell also being coupled to a corresponding adjacent bit line, wherein the control logic includes a sense controller configured to control the voltage generator to: provide, to the word line, a ground voltage in a first period, a pass voltage in a second period after the first period, and a program voltage in a third period after the second period, and provide, to each of the target and adjacent bit lines, a sense signal to set up each of the target and adjacent bit lines in an initial time segment of the third period, wherein the initial time segment is adjusted based on states of the adjacent memory cells and the number of program loops performed.

BRIEF DESCRIPTION OF THE DRAWINGS

FIGS. 16A to 16C are diagrams illustrating a set-up time set based on adjacent memory cell information and/or the number of program loops;

DETAILED DESCRIPTION

Specific structural and functional descriptions are provided herein only to describe embodiments of the invention. However, the present disclosure may be configured, arranged, and/or carried out differently than disclosed herein. Thus, the present disclosure is not limited to any particular embodiment nor to any specific details described in this specification. Also, throughout the specification, reference to "an embodiment," "another embodiment" or the like is not necessarily to only one embodiment, and different references to any such phrase are not necessarily to the same embodiment. Moreover, the use of an indefinite article (i.e., "a" or "an") means one or more, unless it is clear that only one is intended. Similarly, terms "comprising," "including," "having" and the like, when used herein, do not preclude the existence or addition of one or more other elements in addition to the stated element(s).

Embodiments of the present disclosure are described with reference to the accompanying drawings in order for those skilled in the art to be able to implement the technical spirit of the present disclosure.

Figure 1:
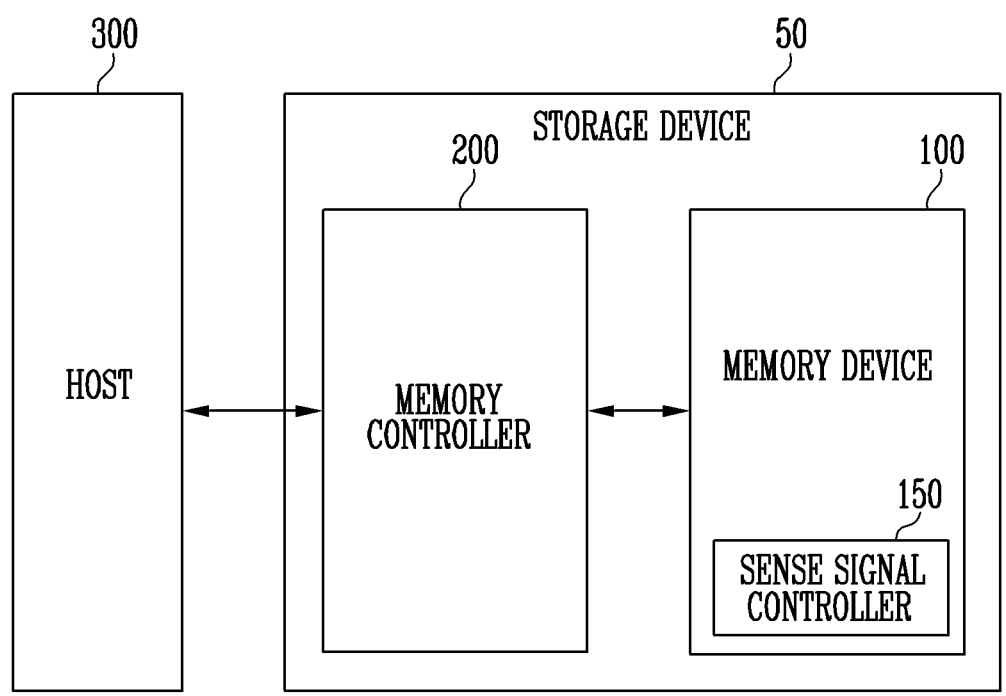
FIG. 1 is a block diagram illustrating a storage device.

FIG. 1 is a block diagram illustrating a storage device 50.

Referring to FIG. 1, the storage device 50 may include a memory device 100 and a memory controller 200.

The storage device 50 may store data in response to control of a host 300. Examples of the host 300 include a cellular phone, a smartphone, an MP3 player, a laptop computer, a desktop computer, a game player, a TV, a tablet PC, and an in-vehicle infotainment system.

The storage device 50 may be configured as any of various types of storage devices according to a host interface corresponding to a communication method with the host 300. For example, the storage device 50 may be configured as a solid state drive (SSD), a multimedia card in the form of a multimedia card (MMC), (e.g., an eMMC, an RS-MMC, or a micro-MMC), a secure digital card in the form of an SD (e.g., a mini-SD or a micro-SD), a universal serial bus (USB) storage device, a universal flash storage (UFS) device, a personal computer memory card international association (PCMCIA) card type storage device, a peripheral component interconnection (PCI) card type storage device, a PCI express (PCI-e) card type storage device, a compact flash (CF) card, a smart media card, or a memory stick.

The storage device 50 may be manufactured as any of various types of packages. For example, the storage device 50 may be manufactured as a package on package (POP), a system in package (SIP), a system on chip (SOC), a multi-chip package (MCP), a chip on board (COB), a wafer-level fabricated package (WFP), or a wafer-level stack package (WSP).

The memory device 100 may store data. The memory device 100 may operate in response to control of the memory controller 200. The memory device 100 may include a memory cell array including a plurality of memory cells storing data. The memory cell array may include a plurality of memory blocks. Each of the memory blocks may include a plurality of memory cells and the plurality of memory cells may form a plurality of pages. According to an embodiment, a page may be a unit for storing data in the memory device 100 or reading data stored in the memory device 100. The memory block may be a unit for erasing data.

According to an embodiment, the memory device 100 may be Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), NAND flash memory, Vertical NAND flash memory, NOR flash memory, resistive random access memory (RRAM), phase-change random access memory (PRAM), magnetoresistive random access memory (MRAM), ferroelectric random access memory (FRAM), or spin-transfer torque random access memory (STT-RAM). By way of example, the memory device 100 is a NAND flash memory in the context of the following description.

The memory device 100 may have a two-dimensional or three-dimensional array structure. Hereinafter, a three-dimensional array structure is described as an embodiment. However, embodiments of the present disclosure are not limited to the three-dimensional array structure. The embodiments of the present disclosure may be applied not only to a flash memory device in which a charge storage layer includes a conductive floating gate (FG), but also to a charge trap flash (CTF) memory device in which a charge storage layer includes an insulating layer.

According to an embodiment, the memory device 100 may operate by a Single-Level Cell (SLC) method in which one memory cell stores one bit of data. Alternatively, the memory device 100 may operate by a method in which one memory cell stores at least two data bits. For example, the memory device 100 may operate by a Multi-Level Cell (MLC) method in which one memory cell stores two bits of data, a Triple-Level Cell (TLC) method in which one memory cell stores three bits of data, or a Quadruple-Level Cell (QLC) method in which one memory cell stores four bits of data.

The memory device 100 may receive a command and an address from the memory controller 200, and access an area selected by the address in the memory cell array. That is, the memory device 100 may perform an operation corresponding to the command on the area selected by the address. For example, the memory device 100 may perform a write operation (or a program operation), a read operation, or an erase operation according to the received command. For example, when a program commend is received, the memory device 100 may program data into the area selected by the address. When a read command is received, the memory device 100 may read data from the area selected by the address. When an erase command is received, the memory device 100 may erase data stored in the area selected by the address.

According to an embodiment, the memory device 100 may include a sense signal controller 150. The sense signal controller 150 may control a signal to be applied to a plurality of page buffers included in the memory device 100.

For example, the sense signal controller 150 may control a signal to be applied to a plurality of page buffers based on a state of memory cells adjacent to a memory cell to be programmed and/or the number of program loops that have already been performed.

More specifically, during a double verify program operation DPGM, the sense signal controller 150 may control a sense signal to be applied to a gate of a first transistor coupled to a selected memory cell through a bit line based on the state of the memory cells adjacent to the selected memory cell to which the double verify program operation DPGM is to be performed. The sense signal controller 150 may control a time for which the sense signal is applied to the gate of the first transistor.

According to an embodiment, the sense signal controller 150 may decrease a time for which the sense signal is applied to the gate of the first transistor when the number of program inhibition memory cells among the memory cells adjacent to the selected memory cell on which the double verify program operation is to be performed increases. Program inhibition memory cells may be memory cells that reach a target program state or memory cells on which performing a program operation itself is inhibited.

In another embodiment, the sense signal controller 150 may increase a time for which the sense signal is applied to the gate of the first transistor when the number of program permission memory cells among the memory cells adjacent to the selected memory cell on which the double verify program operation is to be performed increases. The program permission memory cells may be memory cells to be programmed to a target program state.

During the double verify program operation, the sense signal controller 150 may control the sense signal to be applied to the gate of the first transistor coupled to the selected memory cell through the bit line based on the number of program loops that have already been performed on memory cells of a selected word line coupled to the selected memory cell to which the double verify program operation is to be performed. The sense signal controller 150 may control a time for which the sense signal is applied to the gate of the first transistor.

According to an embodiment, the sense signal controller 150 may decrease a time for which the sense signal is applied to the gate of the first transistor when the number of program loops that have already been performed on the memory cells coupled to the selected word line increases. In another embodiment, the sense signal controller 150 may increase a time for which the sense signal is applied to the gate of the first transistor when the number of program loops that have already been performed on the memory cells coupled to the selected word line decreases.

Further, during the double verify program operation, the sense signal controller 150 may control the sense signal to be applied to the gate of the first transistor coupled to the selected memory cell through the bit line based on both the state of the memory cells adjacent to the selected memory cell to which the double verify program operation is to be performed and the number of program loops that have already been performed on the memory cells of the selected word line coupled to the selected memory cell. The sense signal controller 150 may control a time for which the sense signal is applied to a gate of a transistor.

The memory controller 200 may control general operation of the memory device 50.

When a power voltage is applied to the storage device 50, the memory controller 200 may execute firmware. When the memory device 100 is a flash memory device, the memory controller 200 may execute firmware such as a Flash Translation Layer (FTL) for controlling communication between the host 300 and the memory device 100.

According to an embodiment, the memory controller 200 may receive data and a logical block address (LBA) from the host 300 and include firmware (not shown) that translates the LBA into a physical block address (PBA) indicating an address of memory cells in which data included in the memory device 100 is to be stored. In addition, the memory controller 200 may store a logical-to-physical address mapping table configuring a mapping relationship between the LBA and the PBA in buffer memory.

The memory controller 200 may control the memory device 100 to perform a program operation, a read operation, an erase operation, or the like in response to a request from the host 300. For example, when the memory controller 200 receives a program request from the host 300, the memory controller 200 may switch the program request to a program command and may provide the program command, a PBA, and data to the memory device 100. When the memory controller 200 receives a read request, together with an LBA, from the host 300, the memory controller 200 may switch the read request to a read command, select a PBA corresponding to the LBA, and may then provide the read command and the PBA to the memory device 100. When the memory controller 200 receives an erase request, together with an LBA, from the host 300, the memory controller 200 may switch the erase request to an erase command, select a PBA corresponding to the LBA, and may then provide the erase command and the PBA to the memory device 100.

According to an embodiment, the memory controller 200 may generate and transfer a program command, an address, and data to the memory device 100 without a request from the host 300. For example, the memory controller 200 may provide a command, an address, and data to the memory device 100 to perform background operations, such as a program operation for wear leveling and a program operation for garbage collection.

According to an embodiment, the storage device 50 may further include buffer memory (not shown). The memory controller 200 may control data exchange between the host 300 and the buffer memory. Alternatively, the memory controller 200 may temporarily store system data for controlling the memory device 100 in the buffer memory. For example, the memory controller 200 may temporarily store data input from the host 300 in the buffer memory and transfer the data temporarily stored in the buffer memory to the memory device 100.

According to various embodiments, the buffer memory may serve as operational memory or cache memory of the memory controller 200. The buffer memory may store codes or commands executed by the memory controller 200. Alternatively, the buffer memory may store data processed by the memory controller 200.

According to an embodiment, the buffer memory may include dynamic random access memory (DRAM), such as Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), or Rambus Dynamic Random Access Memory (RDRAM), or static random access memory (SRAM).

According to various embodiments, the buffer memory may be external to the storage device 50 and coupled thereto. In this case, the buffer memory may be implemented by externally coupled volatile memory devices.

According to an embodiment, the memory controller 200 may control at least two memory devices. The memory controller 200 may control the memory devices according to an interleaving scheme so as to improve operational performance.

The host 300 may communicate with the storage device 50 using at least one of various communication methods such as a Universal Serial Bus (USB), Serial AT Attachment (SATA), a Serial Attached SCSI (SAS), a High Speed Interchip (HSIC), a Small Computer System Interface (SCSI), a Peripheral Component Interconnection (PCI), PCI express (PCIe), NonVolatile Memory express (NVMe), Universal Flash Storage (UFS), Secure Digital (SD), a Multi-Media Card (MMC), an embedded MMC (eMMC), a Dual In-line Memory Module (DIMM), a Registered DIMM (RDIMM), and/or a Load Reduced DIMM (LRDIMM).

Figure 2:
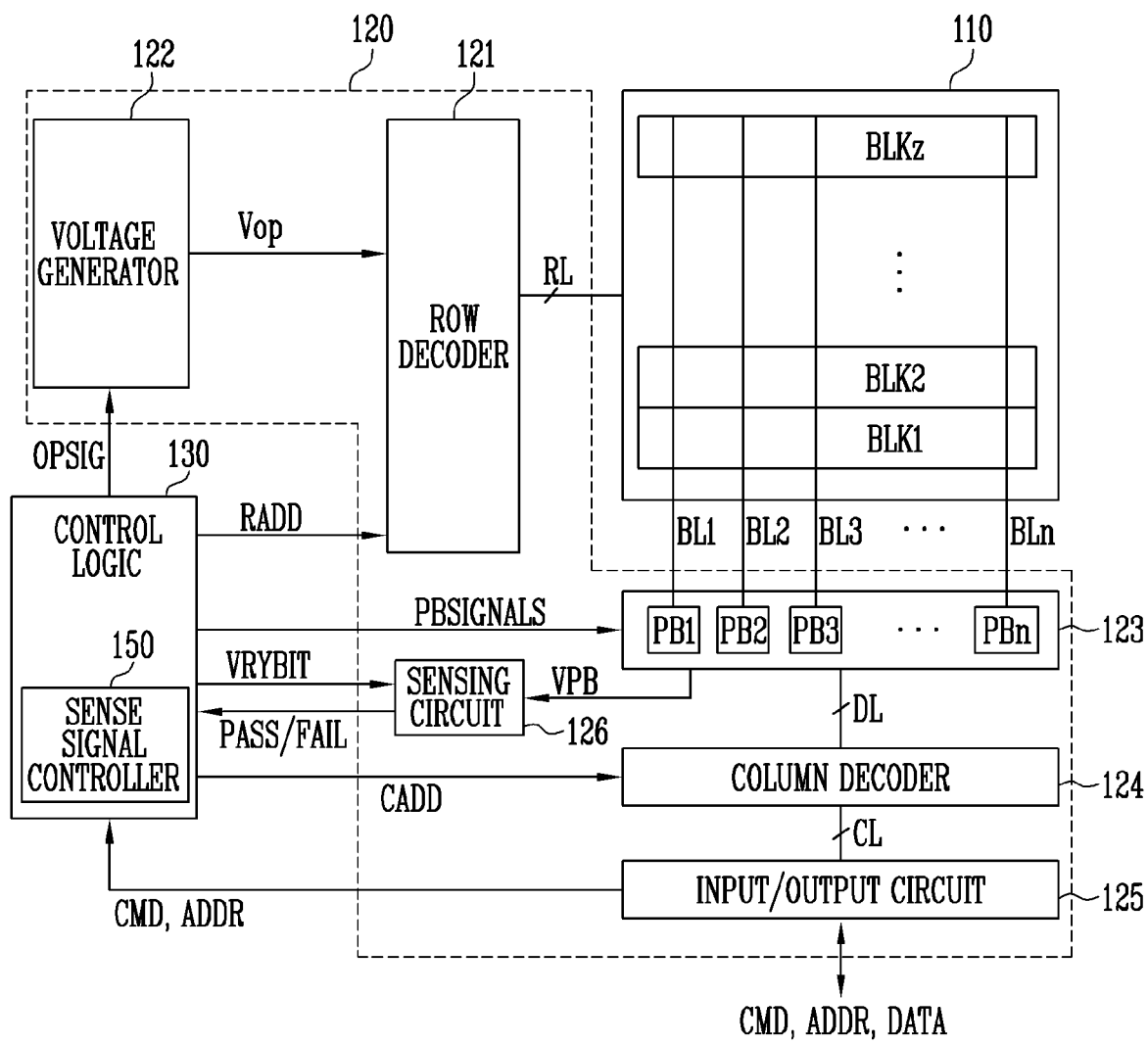
FIG. 2 is a diagram illustrating a structure of a memory device shown in FIG. 1.

FIG. 2 is a diagram illustrating a structure of the memory device 100 shown in FIG. 1.

Referring to FIG. 2, the memory device 100 may include a memory cell array 110, a peripheral circuit 120, and control logic 130.

The memory cell array 110 may include a plurality of memory blocks BLK1 to BLKz, which may be coupled to a row decoder 121 through row lines RL. The plurality of memory blocks BLK1 to BLKz may be coupled to a page buffer group 123 through bit lines BL1 to BLn. Each of the plurality of memory blocks BLK1 to BLKz may include a plurality of memory cells. According to an embodiment, the plurality of memory cells may be nonvolatile memory cells. Memory cells coupled to the same word line may be defined as one page. Therefore, each memory block may include a plurality of pages.

The row lines RL may include at least one source select line, a plurality of word lines, and at least one drain select line.

Each of the memory cells in the memory cell array 110 may include a Single-Level Cell (SLC) storing one bit of data, a Multi-Level Cell (MLC) storing two bits of data, a Triple-Level Cell (TLC) storing three bits of data, or a Quadruple-Level Cell (QLC) storing four bits of data.

The peripheral circuit 120 may be configured to perform a program operation, a read operation, or an erase operation on a selected area in the memory cell array 110 in response to control of the control logic 130. The peripheral circuit 120 may drive the memory cell array 110. For example, the peripheral circuit 120 may apply various operating voltages to the row lines RL and the bit lines BL1 to BLn or discharge the applied voltages in response to the control of the control logic 130.

The peripheral circuit 120 may include the row decoder 121, a voltage generator 122, the page buffer group 123, a column decoder 124, an input/output circuit 125, and a sensing circuit 126.

The row decoder 121 may be coupled to the memory cell array 110 through the row lines RL. The row lines RL may include at least one source select line, a plurality of word lines, and at least one drain select line. According to an embodiment, the word lines may include normal word lines and dummy word lines. According to an embodiment, the row lines RL may further include a pipe select line.

The row decoder 121 may decode a row address RADD received from the control logic 130. The row decoder 121 may select at least one memory block among the memory blocks BLK1 to BLKz according to the decoded address. The row decoder 121 may select at least one word line of the memory block selected to apply voltages generated by the voltage generator 122 to at least one word line according to the decoded address.

For example, during a program operation, the row decoder 121 may apply a program voltage to the selected word line and a program pass voltage lower than the program voltage to unselected word lines. During a program verify operation, the row decoder 121 may apply a verify voltage to the selected word line and a verify pass voltage higher than the verify voltage to the unselected word lines. During a read operation, the row decoder 121 may apply a read voltage to the selected word line and a read pass voltage higher than the read voltage to the unselected word lines.

According to an embodiment, an erase operation of the memory device 100 may be performed in units of memory blocks. During the erase operation, the row decoder 121 may select one of the memory blocks according to the decoded address. During the erase operation, the row decoder 121 may apply a ground voltage to word lines coupled to the selected memory block.

The voltage generator 122 may operate in response to the control of the control logic 130. The voltage generator 122 may be configured to generate a plurality of voltages by using an external power voltage supplied to the memory device 100. More specifically, the voltage generator 122 may generate various operating voltages Vop applied to perform program, read and erase operations in response to an operation signal OPSIG. For example, the voltage generator 122 may generate a program voltage, a verify voltage, a pass voltage, a read voltage, and an erase voltage in response to the control of the control logic 130.

According to an embodiment, the voltage generator 122 may generate an internal power voltage by regulating an external power voltage. The internal power voltage generated by the voltage generator 122 may be used as an operating voltage of the memory device 100.

According to an embodiment, the voltage generator 122 may generate a plurality of voltages by using the external power voltage or the internal power voltage.

For example, the voltage generator 122 may include a plurality of pumping capacitors receiving the internal power voltage and generate a plurality of voltages by selectively activating the plurality of pumping capacitors in response to the control of the control logic 130.

The plurality of generated voltages may be supplied to the memory cell array 110 by the row decoder 121.

The page buffer group 123 may include first to nth page buffers PB1 to PBn, which may be coupled to the memory cell array 110 through the first to nth bit lines BL1 to BLn, respectively. The first to nth page buffers PB1 to PBn may operate in response to the control of the control logic 130. More specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or may sense voltages or currents of the bit lines BL1 to BLn during a read or verify operation.

More specifically, during a program operation, the first to nth page buffers PB1 to PBn may transfer data DATA received through the column decoder 124 and the input/output circuit 125 to selected memory cells through the first to nth bit lines BL1 to BLn when a program voltage is applied to a selected word line. Memory cells of the selected page may be programmed according to the transferred data DATA. During a program verify operation, the first to nth page buffers PB1 to PBn may read page data from the selected memory cells by sensing a voltage or a current received through the first to nth bit lines BL1 to BLn.

During a read operation, the first to nth page buffers PB1 to PBn may read the data DATA from the memory cells of the selected page through the first to nth bit lines BL1 to BLn and output the read data DATA to the input/output circuit 125 in response to control of the column decoder 124.

During an erase operation, the first to nth page buffers PB1 to PBn may float the first to nth bit lines BL1 to BLn or may apply an erase voltage.

The column decoder 124 may transfer data between the input/output circuit 125 and the page buffer group 123 in response to a column address CADD. For example, the column decoder 124 may exchange data with the first to nth page buffers PB1 to PBn through data lines DL, or exchange data with the input/output circuit 125 through column lines CL.

The input/output circuit 125 may transfer a command CMD and an address ADDR received from the memory controller 200 described with reference to FIG. 1 to the control logic 130, or may exchange the data DATA with the column decoder 124.

The sensing circuit 126 may generate a reference current in response to an allowable bit VRYBIT and compare a sensing voltage VPB received from the page buffer group 123 with a reference voltage generated by the reference current to output a pass signal PASS or a fail signal FAIL during a read operation or a verify operation.

The control logic 130 may control the peripheral circuit 120 by outputting the operation signal OPSIG, the row address RADD, the page buffer control signals PBSIG-NALS and the allowable bit VRYBIT in response to the command CMD and the address ADDR. For example, the control logic 130 may control a read operation on a selected memory block in response to a sub-block read command and an address. In addition, the control logic 130 may control an erase operation on a selected sub-block included in the selected memory block in response to a sub-block erase command and the address. In addition, the control logic 130 may determine whether a verify operation passes or fails in response to the pass or fail signal PASS or FAIL.

According to an embodiment, the control logic 130 may include the sense signal controller 150. In FIG. 2, it is illustrated that the sense signal controller 150 is included in the control logic 130. However, according to another embodiment, the sense signal controller 150 may be located outside the control logic 130.

The sense signal controller 150 may set a bit line set-up time for which a signal is applied to a gate of a transistor coupled to the selected memory cell through a bit line. The transistor coupled to the selected memory cell through the bit line may be one of a plurality of transistors included in a page buffer.

According to an embodiment, the sense signal controller 150 may set a bit line set-up time based on memory cells adjacent to the selected memory cell. For example, the sense signal controller 150 may set the bit line set-up time to be increased, when the number of program permission memory cells, among the memory cells adjacent to the selected memory cell, increases.

According to an embodiment, the sense signal controller 150 may set a bit line set-up time based on the number of program loops performed on the selected memory cell. For example, the sense signal controller 150 may set the bit line set-up time to be increased, when the number of program loops performed on the selected memory cell decreases.

Figure 3:
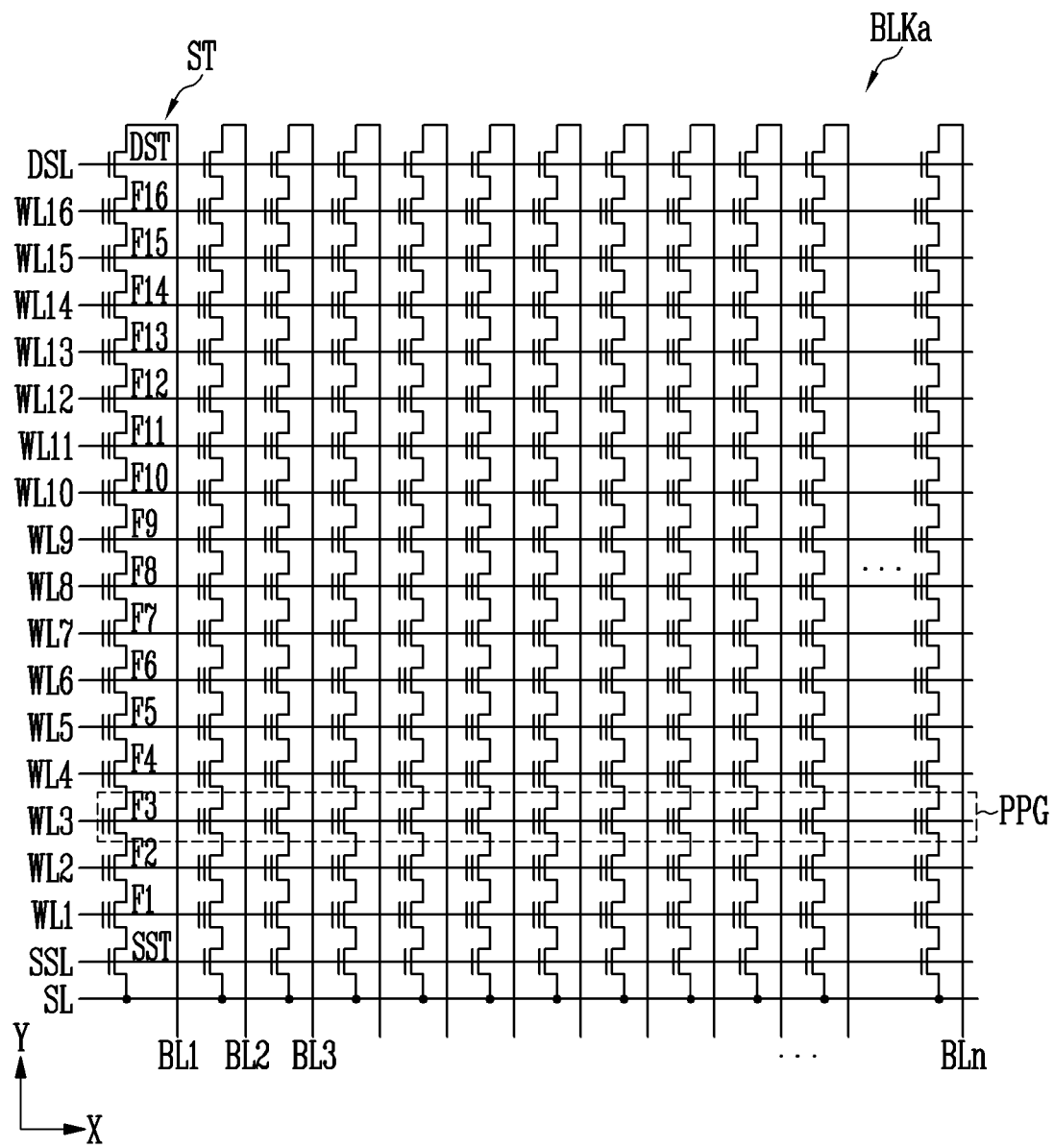
FIG. 3 is a diagram illustrating an embodiment of a memory cell array shown in FIG. 2.

FIG. 3 is a diagram illustrating an embodiment of the memory cell array 110 shown in FIG. 2.

FIG. 3 is a circuit diagram showing a representative memory block BLKa among the plurality of memory blocks BLK1 to BLKz in the memory cell array 110 shown in FIG. 2.

A first select line, word lines, and a second select line arranged in parallel with each other may be coupled to the memory block BLKa. For example, the word lines may be arranged in parallel with each other between the first and second select lines. The first select line may be a source select line SSL and the second select line may be a drain select line DSL.

More specifically, the memory block BLKa may include a plurality of strings coupled between the bit lines BL1 to BLn and a source line SL. The bit lines BL1 to BLn may be coupled to the strings, respectively, and the source line SL may be coupled in common to the strings. Because the strings may have the same configuration, a string ST coupled to the first bit line BL1 is described in detail as an example.

The string ST may include a source select transistor SST, a plurality of memory cells F1 to F16, and a drain select transistor DST coupled in series between the source line SL and the first bit line BL1. In another embodiment, each string ST may include one or more source select transistors SST, one or more drain select transistors DST, and more than the 16 memory cells F1 to F16 shown in FIG. 3.

A source of the source select transistor SST may be coupled to the source line SL and a drain of the drain select transistor DST may be coupled to the first bit line BL1. The memory cells F1 to F16 may be coupled in series between the source select transistor SST and the drain select transistor DST. Gates of the source select transistors SST included in different strings may be coupled to the source select line SSL, gates of the drain select transistors DST included in the different strings may be coupled to the drain select line DSL, and gates of the memory cells F1 to F16 included in the different strings may be coupled to a plurality of word lines WL1 to WL16, respectively. A group of memory cells coupled to the same word line, among memory cells included in different strings, may be referred to as a physical page PPG. Therefore, the memory block BLKa may include as many physical pages PPG as the number of word lines WL1 to WL16.

A single memory cell may store one bit of data. This memory cell may be called a Single-Level Cell (SLC). The single physical page PPG including SLCs may store data of a single logical page LPG. The data of the single logical page LPG may include as many bits of data as the number of memory cells included in the single physical page PPG. Alternatively, a single memory cell may store two or more bits of data. Typically, this memory cell may be called a Multi-Level Cell (MLC). The single physical page PPG including MLCs may store data of two or more logical pages LPG.

MLC may generally refer to a single memory cell that stores two or more bits of data. However, recently, as memory cell capacity has increased, MLC may refer more specifically to a memory cell storing two bits of data, in which case a memory cell storing three bits of data may be called a Triple-Level Cell (TLC), and a memory cell storing four bits of data may be called a Quadruple-Level Cell (QLC). Higher capacity memory cells are also available. Thus, various types of memory cells storing data have been developed, and memory cells of any suitable configuration may be used in embodiments described herein.

According to another embodiment, a memory block may have a three-dimensional structure. Each memory block may include a plurality of memory cells stacked over a substrate. The plurality of memory cells may be arranged in a +X direction, a +Y direction, and a +Z direction.

Figure 4:
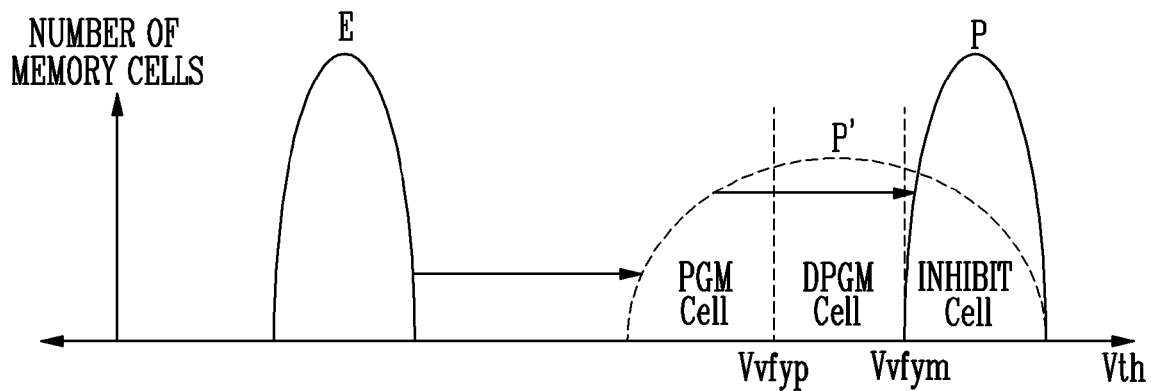
FIG. 4 is a diagram illustrating a double verify program operation.

FIG. 4 is a diagram illustrating the double verify program operation DPGM.

By way of example, FIG. 4 illustrates a process of programming memory cells from an erase state E to a program state P by the double verify program operation DPGM. In FIG. 4, a horizontal axis refers to a threshold voltage Vth of memory cells and a vertical axis refers to the number of memory cells.

In FIG. 4, by way of example, it is assumed that the memory device 100 in FIG. 1 performs a program operation by a Single-Level Cell (SLC) method. However, according to another embodiment, the memory device 100 in FIG. 1 may perform a program operation by a Multi-Level Cell (MLC) method, a Triple-Level Cell (TLC) method, or a Quadruple-Level Cell (QLC) method.

Referring to FIG. 4, the memory cells in the erase state E may be programmed to the program state P by a double verify program operation. The memory cells in the erase state E may be programmed to the program state P, that is, a target program state, via a state P'.

According to an embodiment, a double verify program operation may include a program pulse applying operation and a verify operation. The verify operation may be performed at levels of two verify voltages. The two verify voltages may be a pre-verify voltage Vvfyp and a main verify voltage Vvfym. The main verify voltage Vvfym may correspond to the target program state P. The pre-verify voltage Vvfyp may be lower than the main verify voltage Vvfym and may be for verifying a degree to which the program operation is performed.

Accordingly, the verify operation may include a verify operation performed using the pre-verify voltage Vvfyp and a verify operation performed using the main verify voltage Vvfym.

According to an embodiment, the verify operation may be performed using the pre-verify voltage Vvfyp and the main verify voltage Vvfym after a program pulse is applied to the memory cells in the erase state E. According to a result of the verify operation, the memory cells may be classified into three types of memory cells, that is, first program permission memory cells PGM cells, second program permission memory cells DPGM cells, and program inhibition memory cells INHIBIT cells. The first program permission memory cells PGM cells may have a threshold voltage lower than the pre-verify voltage Vvfyp. The second program permission memory cells DPGM cells may have a threshold voltage higher than the pre-verify voltage Vvfyp and lower than the main verify voltage Vvfym. The program inhibition memory cells INHIBIT cells may have a threshold voltage higher than the main verify voltage Vvfym.

Because the program inhibition memory cells INHIBIT cells, each having a threshold voltage higher than the main verify voltage Vvfym are already in the target program state P, a program pulse need not be applied to gates of the program inhibition memory cells INHIBIT cells any longer.

However, because the first program permission memory cells PGM cells and the second program permission memory cells DPGM cells have not reached the target program state P yet, the program pulse may be applied to the first and second program permission memory cells PGM cells and DPGM cells again.

A voltage level of a bit line coupled to each of the first program permission memory cells PGM cells may be set different from a voltage level of a bit line coupled to each of the second program permission memory cells DPGM cells.

In other words, the first program permission memory cells PGM cells, each having a threshold voltage lower than the pre-verify voltage Vvfyp are slow cells on which a program operation is performed at a relatively low speed, whereas the second program permission memory cells DPGM cells, each having a threshold voltage higher than the pre-verify voltage Vvfyp and lower than the main verify voltage Vvfym are fast cells on which the program operation is performed at a relatively high speed. Thus, the voltage level of the bit line coupled to each of the first program permission memory cells PGM cells and the voltage level of the bit line coupled to each of the second program permission memory cells DPGM cells may be set different from each other to perform the program operation.

For example, the voltage level of the bit line coupled to each of the first program permission memory cells PGM cells may be set to a ground voltage GND level and the voltage level of the bit line coupled to each of the second program permission memory cells DPGM cells may be set to another specific voltage level different than the ground voltage GND level. In other words, because the speed of performing the program operation on the second program permission memory cells DPGM cells is relatively high compared to the speed of performing the program operation on the first program permission memory cells PGM cells, the voltage level of the bit line may be set to the specific level which is different than the ground voltage GND level considering the speed of performing the program operation.

As a result, the voltage level of the bit line coupled to each of the first program permission memory cells PGM cells and the voltage level of the bit line coupled to each of the second program permission memory cells DPGM cells may be set different from each other, and therefore a threshold voltage distribution of the memory cells may be narrowed.

Figure 5A:
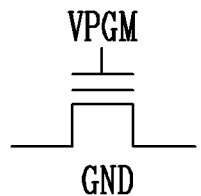
FIGS. 5A to 5C are diagrams illustrating magnitude of a voltage applied to a gate of a memory cell and a bit line during a double verify program operation.
Figure 5B:
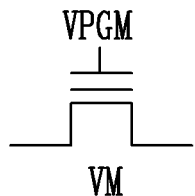
Figure 5C:
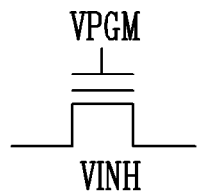

FIGS. 5A to 5C are diagrams illustrating magnitude of a voltage applied to a gate of a memory cell and a bit line during the double verify program operation DPGM.

Referring to FIGS. 4 and 5, FIG. 5A illustrates one of the first program permission memory cells PGM cells of FIG. 4, FIG. 5B illustrates one of the second program permission memory cells DPGM cells of FIG. 4, and FIG. 5C illustrates one of the program inhibition memory cells INHIBIT cells of FIG. 4.

FIG. 5A illustrates a method of programming the first program permission memory cells PGM cells having a threshold voltage lower than the pre-verify voltage Vvfyp shown in FIG. 4. More specifically, a program voltage VPGM may be applied to gates of the first program permission memory cells PGM cells and the voltage level of the bit line coupled to each of the first program permission memory cells PGM cells may be 0V, that is, the level of the ground voltage GND.

FIG. 5B illustrates a method of programming the second program permission memory cells DPGM cells, each having a threshold voltage higher than the pre-verify voltage Vvfyp and lower than the main verify voltage Vvfym, shown in FIG. 4. More specifically, the program voltage VPGM may be applied to gates of the second program permission memory cells DPGM cells and a bit line voltage of VM, for example, 1V may be applied to the bit line coupled to each of the second program permission memory cells DPGM cells.

FIG. 5C illustrates a method of programming the program inhibition memory cells INHIBIT cells, each having a threshold voltage higher than the main verify voltage Vvfym, shown in FIG. 4. More specifically, the program voltage VPGM may be applied to gates of the program inhibition memory cells INHIBIT cells. However, because the program inhibition memory cells INHIBIT cells have already reached the target program state, a program inhibition voltage VINH, for example, 2V may be applied to a bit line coupled to each of the program inhibition memory cells INHIBIT cells, such that further program operation is prevented from being performed on the program inhibition memory cells INHIBIT cells.

According to an embodiment, during the double verify program operation DPGM on memory cells, a verify operation may be performed using the pre-verify voltage Vvfyp and the main verify voltage Vvfym. According to a result of the verify operation, the memory cells may correspond to one of states of FIGS. 5A to 5C. Accordingly, the double verify program operation DPGM may be performed based on the memory cells that are classified depending on the result of the verify operation performed using the pre-verify voltage Vvfyp and the main verify voltage Vvfym.

However, when the double verify program operation DPGM is performed, a voltage of a bit line might not be set to a desired value depending on a state of adjacent memory cells and/or the number of program loops that have already been performed.

Therefore, according to an embodiment of the present disclosure, a method of setting a voltage of a bit line to a target level, by adjusting a time for which a signal is applied to a transistor included in a page buffer coupled to the bit line, may be provided. In other words, according to an embodiment of the present disclosure, to perform a double verify program operation, a method of setting the voltage of the bit line to the target level, by setting a time for which the bit line is set up, may be provided.

Figure 6:
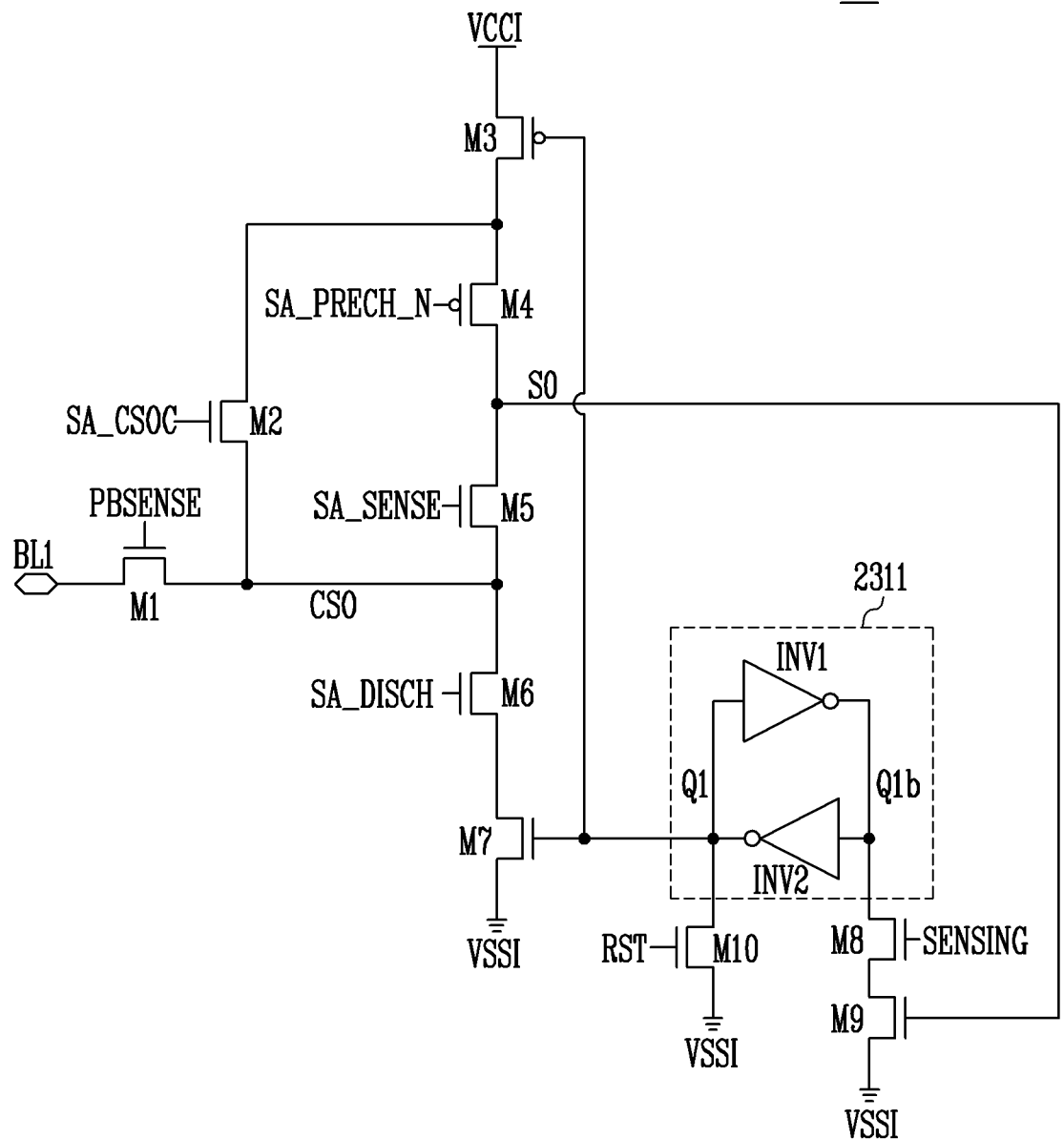
FIG. 6 is a diagram illustrating components of a page buffer coupled to a bit line.

FIG. 6 is a diagram illustrating components of a page buffer coupled to a bit line.

By way of example, FIG. 6 illustrates components included in the first page buffer PB1 among the plurality of page buffers PB1 to PBn shown in FIG. 2. However, each of the second to nth page buffers PB2 to PBn may have substantially the same components as the first page buffer PB1 shown in FIG. 6.

According to an embodiment, the first page buffer PB1 may be coupled to a first memory cell MC1 through the first bit line BL1. The first page buffer PB1 may perform a bit line BL precharge operation in which charges supplied from an internal power voltage VCCI may be charged to the first bit line BL1 through first to fifth transistors M1 to M5. The first transistor M1 may be controlled by a first sense signal PBSENSE. The second transistor M2 may be controlled by a first precharge signal SA_CSOC. The third transistor M3 may be controlled by a first latch 2311. The fourth transistor M4 may be controlled by a second precharge signal SA_P-RECH_N. The fifth transistor M5 may be controlled by a second sense signal SA_SENSE.

In addition, the first page buffer PB1 may discharge the charges charged to the first bit line BL1 to an internal ground voltage VSSI through the first transistor M1, a sixth transistor M6, and a seventh transistor M7. The sixth transistor M6 may be controlled by a first discharge signal SA_DISCH. The seventh transistor M7 may be controlled by the first latch 2311.

According to an embodiment, the first page buffer PB1 may include the first latch 2311 including a first inverter INV1 and a second inverter INV2. The first latch 2311 may control the bit line BL precharge operation by turning on or off the third transistor M3 through a first queue Q1 node. A first queue bar Q1b node and the first queue Q1 node may have values inverted relative to each other.

During a sensing operation on the first memory cell MC1, a voltage of a sense out SO node may be determined based on a threshold voltage of the first memory cell MC1. The first latch 2311 may store a result of sensing the threshold voltage of the first memory cell MC1 through a ninth transistor M9 coupled to the sense out SO node. The ninth transistor M9 may be an n-type MOS transistor and the sense out SO node may be coupled to a gate node of the ninth transistor M9.

Therefore, when the first memory cell MC1 has a low threshold voltage, the sense out SO node may be at a low level and the ninth transistor M9 may be turned off during the sensing operation. When the first memory cell MC1 has a high threshold voltage, the sense out SO node may be at a high level and the ninth transistor M9 may be turned on during the sensing operation.

According to an embodiment, the first inverter INV1 and the second inverter INV2 included in the first latch 2311 may be coupled to the internal power voltage VCCI and the internal ground voltage VSSI, respectively.

Figure 7:
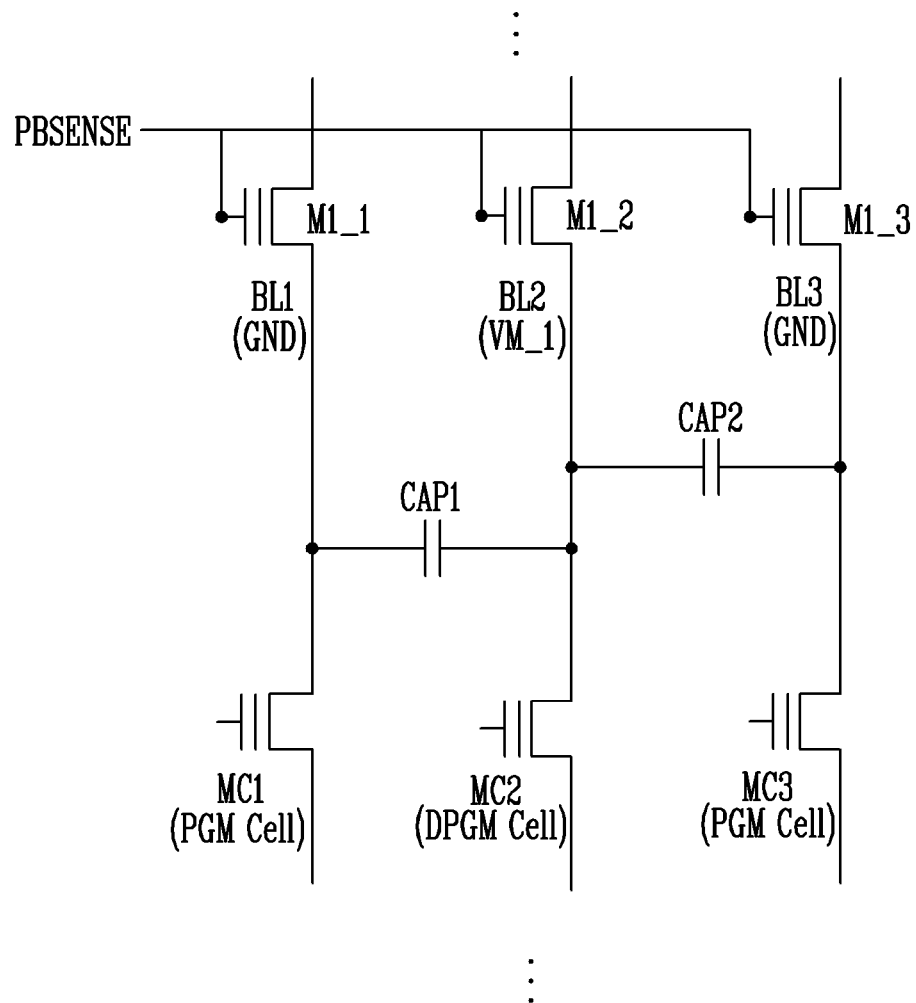
FIG. 7 is a diagram illustrating a potential of a bit line when memory cells adjacent to a memory cell on which a double verify program operation is performed are program permission cells.

FIG. 7 is a diagram illustrating a potential of a bit line when memory cells adjacent to a memory cell on which the double verify program operation DPGM is performed are program permission cells.

FIG. 7 illustrates some of memory cells of the first word line WL1 coupled to one of the plurality of memory blocks BLK1 to BLKz included in the memory cell array 110 shown in FIG. 2.

In FIG. 7, it is assumed that the memory device 100 shown in FIG. 2 programs first, second, and third memory cells MC1, MC2, and MC3 among the memory cells coupled to the first word line WL1. Further, it is assumed that the first, second, and third memory cells MC1, MC2, and MC3 are programmed by a Single-Level Cell (SLC) method. A program operation performed on the first, second, and third memory cells MC1, MC2, and MC3 may be the double verify program operation DPGM.

According to an embodiment, the verify operation may be performed using the pre-verify voltage Vvfyp and the main verify voltage Vvfym after a program pulse is applied to the first word line WL1. According to a result of the verify operation, each of the first, second, and third memory cells MC1, MC2, and MC3 may be determined as one of the first program permission memory cells PGM cells each having a threshold voltage lower than the pre-verify voltage Vvfyp, the second program permission memory cells DPGM cells each having a threshold voltage higher than the pre-verify voltage Vvfyp and lower than the main verify voltage Vvfym, and the program inhibition memory cells INHIBIT cells each having a threshold voltage higher than the main verify voltage Vvfym.

In FIG. 7, each of the first and third memory cells MC1 and MC3 may be one of the first program permission memory cells PGM, that is, a PGM cell and the second memory cell MC2 may be one of the second program permission memory cells DPGM, that is, a DPGM cell.

Accordingly, in the double verify program operation DPGM, bit line voltages of different levels may be applied to the bit lines BL1, BL2, and BL3 coupled to the first, second, and third memory cells MC1, MC2, and MC3, respectively.

For example, when each of the first and third memory cells MC1 and MC3 is one of the first program permission memory cells PGM cells and the speed of performing the program operation on each of the first and third memory cells MC1 and MC3 is relatively low compared to the speed of performing the program operation on the second memory cell MC2, the ground voltage GND may be set to the first bit line BL1 coupled to the first memory cell MC1 and the third bit line BL3 coupled to the third memory cell MC3.

However, when the second memory cell MC2 is one of the second program permission memory cells DPGM cells and the speed of performing the program operation on the second memory cell MC2 is relatively high compared to the speed of performing the program operation on each of the first memory cell MC1, a voltage VM_1 may be set to the second bit line BL2 coupled to the second memory cell MC2 to program the second memory cell MC2.

A signal PBSENSE may be applied to a gate of each of transistors M1_1, M1_2, and M1_3 to set a voltage level of each of the first, second, and third bit lines BL1, BL2, and BL3. Any of the transistors M1_1, M1_2, and M1_3 may be the first transistor M1 shown in FIG. 6, and the signal PBSENSE may be the first sense signal PBSENSE shown in FIG. 6.

According to an embodiment, parasitic capacitance CAP1 may be caused between the first and second bit lines BL1 and BL2, and parasitic capacitance CAP2 may be caused between the second and third bit lines BL2 and BL3 during a process of programming the second memory cell MC2 corresponding to the second program permission memory cells DPGM cells. In other words, the parasitic capacitances CAP1 and CAP2 may be caused because the first and third memory cells MC1 and MC3 that are adjacent to the second memory cell MC2 are the first program permission memory cells PGM cells, when the second memory cell MC2 is programmed.

Because CAP1 is caused between BL1 and BL2 and CAP2 is caused between BL2 and BL3, the second bit line BL2 coupled to the second memory cell MC2 may reach a target voltage level faster, i.e., in less time. For example, although a target voltage level of the second bit line BL2 is 1V, 0.523V which is lower than 1V may be set as a voltage level VM_1 of the second bit line BL2 due to the parasitic capacitance CAP1 and the parasitic capacitance CAP2.

Therefore, according to an embodiment of the present disclosure, a method of causing the voltage level of the second bit line BL2 to reach the target level may be provided.

Figure 8:
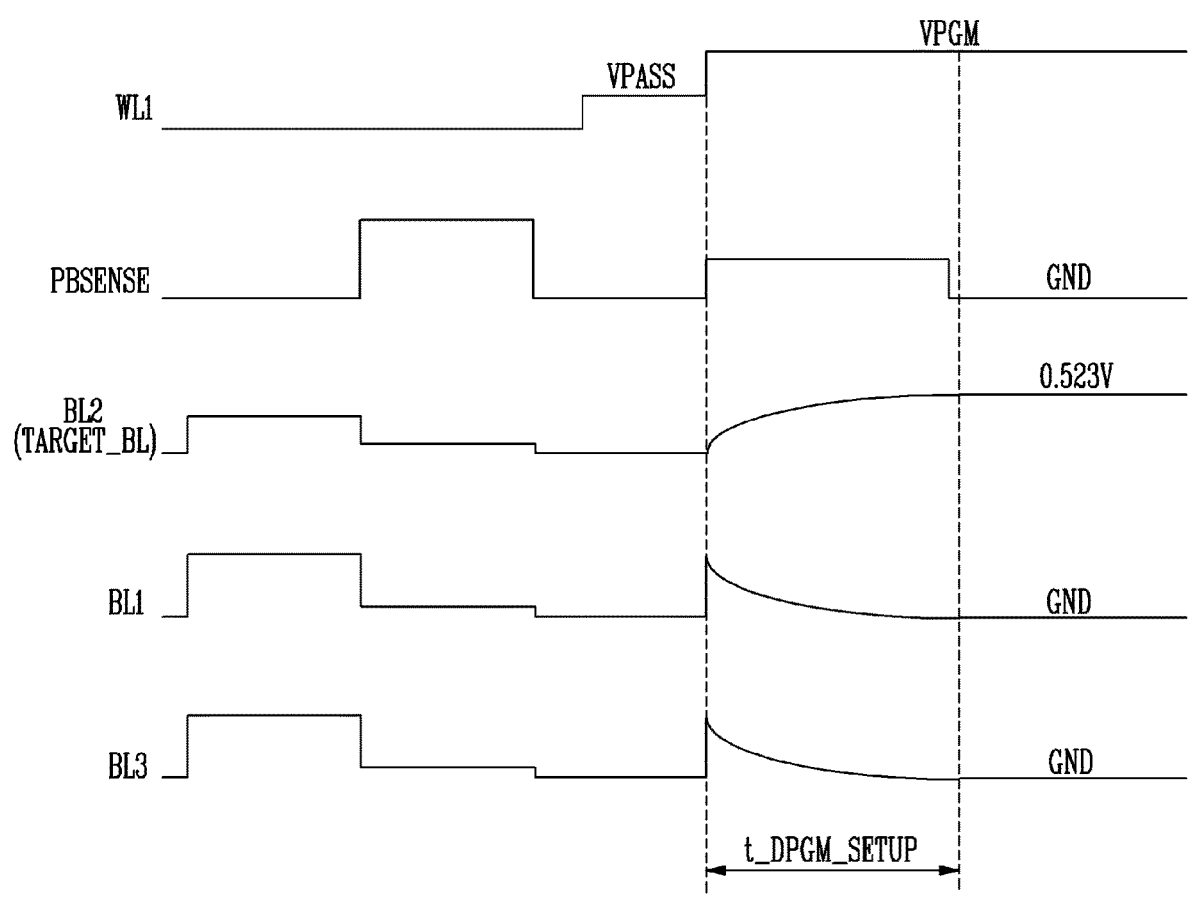
FIG. 8 is a timing diagram illustrating a voltage level of each bit line and magnitude of a signal PBSENSE during a double verify program operation of FIG. 7.

FIG. 8 is a timing diagram illustrating a voltage level of each bit line and magnitude of the signal PBSENSE during the double verify program operation DPGM of FIG. 7.

FIG. 8 illustrates a process in which a voltage level of the second bit line BL2 coupled to the second memory cell MC2 varies when the second memory cell MC2 shown in FIG. 7 is programmed.

According to an embodiment, the program voltage VPGM may be applied to the first word line WL1 coupled to the first, second, and third memory cells MC1, MC2, and MC3. In other words, the program voltage to program the first, second, and third memory cells MC1, MC2, and MC3 may be applied to the first word line WL1.

A voltage VPASS may be applied to the first word line WL1 before the program voltage VPGM is applied to the first word line WL1. That is, a level of a voltage applied to the first word line WL1 may be increased from the ground voltage GND level to the voltage VPASS level and may then be increased from the voltage VPASS level to the program voltage VPGM level.

A precharge operation for programming the first, second, and third memory cells MC1, MC2, and MC3 may be performed before the program voltage VPGM is applied to the first word line WL1. The signal PBSENSE may be in a high state for a set time during the precharge operation. A voltage level of each of the first, second, and third bit lines BL1, BL2, and BL3 may be gradually decreased from a precharge level to the ground voltage GND level.

Subsequently, the signal PBSENSE may be in a high state for a bit line set-up time t_DPGM_SETUP to program the first, second, and third memory cells MC1, MC2, and MC3 to a target program state.

According to an embodiment, because the first and third memory cells MC1 and MC3 are first program permission memory cells PGM cells, and therefore the signal PBSENSE is in a high state, a voltage level of each of the first bit line BL1 coupled to the first memory cell MC1 and the third bit line BL3 coupled to the third memory cell MC3 may be increased and then set to the ground voltage GND level.

According to an embodiment, the second memory cell MC2 is one of the second program permission memory cells DPGM cells, and therefore the signal PBSENSE is in a high state. Thus, a voltage level of the second bit line BL2 coupled to the second memory cell MC2 may be gradually increased to a VM level. The VM level, which is a target voltage level of the second bit line BL2, may be 1V.

However, as described above with reference to FIG. 7, because the parasitic capacitance CAP1 is caused between the first and second bit lines BL1 and BL2 and the parasitic capacitance CAP2 is caused between the second and third bit lines BL2 and BL3, the second bit line BL2 coupled to the second memory cell MC2 may reach a target voltage level faster, i.e., in less time. For example, a target voltage level of the second bit line BL2 is 1V, but 0.523V may be set as a voltage level of the second bit line BL2 due to the parasitic capacitances CAP1 and CAP2.

Figure 9:
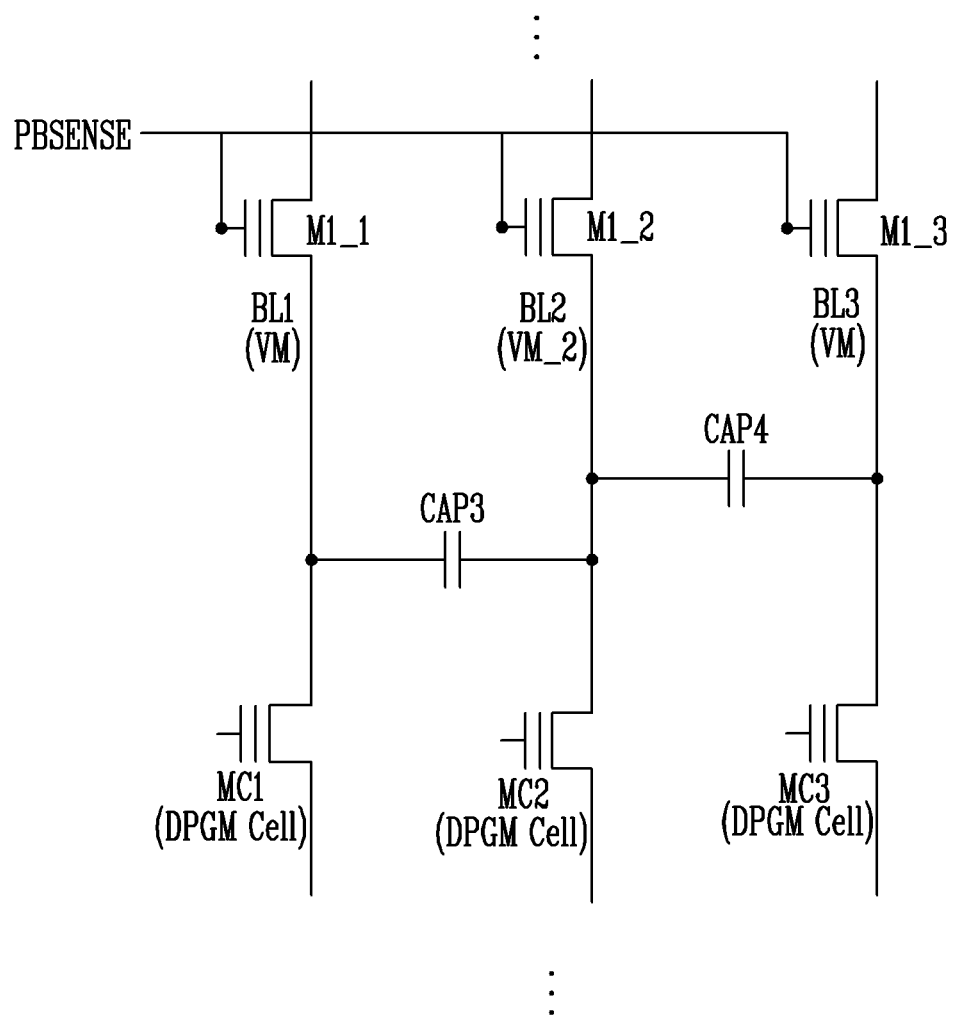
FIG. 9 is a diagram illustrating a potential of a bit line when a double verify program operation is performed on memory cells adjacent to a memory cell on which the double verify program operation is performed.

FIG. 9 is a diagram illustrating a potential of a bit line when the double verify program operation DPGM is performed on memory cells adjacent to a memory cell on which the double verify program operation DPGM is performed.

In FIG. 9, it is assumed that the memory device 100 shown in FIG. 2 programs the first, second, and third memory cells MC1, MC2, and MC3 among the memory cells coupled to the first word line WL1. Further, it is assumed that the first, second, and third memory cells MC1, MC2, and MC3 are programmed by a Single-Level Cell (SLC) method. A program operation performed on the first, second, and third memory cells MC1, MC2, and MC3 may be the double verify program operation DPGM.

According to an embodiment, the verify operation may be performed using the pre-verify voltage Vvfyp and the main verify voltage Vvfym after a program pulse is applied to the first word line WL1. According to a result of the verify operation, the first, second, and third memory cells MC1, MC2, and MC3 may be determined as one of the first program permission memory cells PGM cells each having a threshold voltage lower than the pre-verify voltage Vvfyp, the second program permission memory cells DPGM cells each having a threshold voltage higher than the pre-verify voltage Vvfyp and lower than the main verify voltage Vvfym, and the program inhibition memory cells INHIBIT cells each having a threshold voltage higher than the main verify voltage Vvfym.

In FIG. 9, each of the first, second, and third memory cells MC1, MC2, and MC3 may be one of the second program permission memory cells DPGM cells. Accordingly, a voltage level of each of the bit lines BL1, BL2, and BL3 coupled to the first, second, and third memory cells MC1, MC2, and MC3, respectively, may be set to the VM level.

In other words, because the first, second, and third memory cells MC1, MC2, and MC3 are second program permission memory cells DPGM cells, and thus the speed of performing the program operation on MC1, MC2, and MC3 is relatively high compared to the speed of performing the program operation on the first program permission memory cells PGM cells, each of the first, second, and third bit lines BL1, BL2, and BL3 may be set to the VM voltage.

The signal PBSENSE may be applied to the gate of each of transistors M1_1, M1_2, and M1_3 to set a voltage level of each of the first, second, and third bit lines BL1, BL2, and BL3. Any of the transistors M1_1, M1_2, and M1_3 may be the first transistor M1 shown in FIG. 6, and the signal PBSENSE may be the first sense signal PBSENSE shown in FIG. 6.

According to an embodiment, parasitic capacitance CAP3 may be caused between the first and second bit lines BL1 and BL2 and parasitic capacitance CAP4 may be caused between the second and third bit lines BL2 and BL3 during a process of programming the second memory cell MC2 corresponding to the second program permission memory cells DPGM cells. In other words, because the first and third memory cells MC1 and MC3 that are adjacent to the second memory cell MC2 are second program permission memory cells DPGM cells, when the second memory cell MC2 is programmed, the parasitic capacitances CAP3 and CAP4 may be caused.

Referring to FIG. 7, each of the parasitic capacitance CAP3 and the parasitic capacitance CAP4 shown in FIG. 9 may be smaller than each of the parasitic capacitance CAP1 and the parasitic capacitance CAP2 shown in FIG. 7. In other words, because the first and third bit lines BL1 and BL3 adjacent to the second bit line BL2 may be set to the same VM level as the second bit line BL2, each of the parasitic capacitance CAP3 and the parasitic capacitance CAP4 shown in FIG. 9 may be relatively small compared to each of the parasitic capacitance CAP1 and the parasitic capacitance CAP2 shown in FIG. 7. Accordingly, a speed at which the second bit line BL2 shown in FIG. 9 is set to the VM level is higher than a speed at which the second bit line BL2 shown in FIG. 7 is set to the VM level.

However, because the parasitic capacitances CAP3 and CAP4 are caused, a speed at which a voltage level of the second bit line BL2 coupled to the second memory cell MC2 reaches a target level still may be lower than a speed without parasitic capacitance. For example, although a target voltage level of the second bit line BL2 is 1V, 0.637V, which is lower than 1V (the target voltage level in this example), may be set as a voltage level VM_2 of the second bit line BL2 due to the parasitic capacitance CAP3 and the parasitic capacitance CAP4.

Therefore, according to an embodiment of the present disclosure, a method of causing the voltage level of the second bit line BL2 to reach the target level may be provided.

Figure 10:
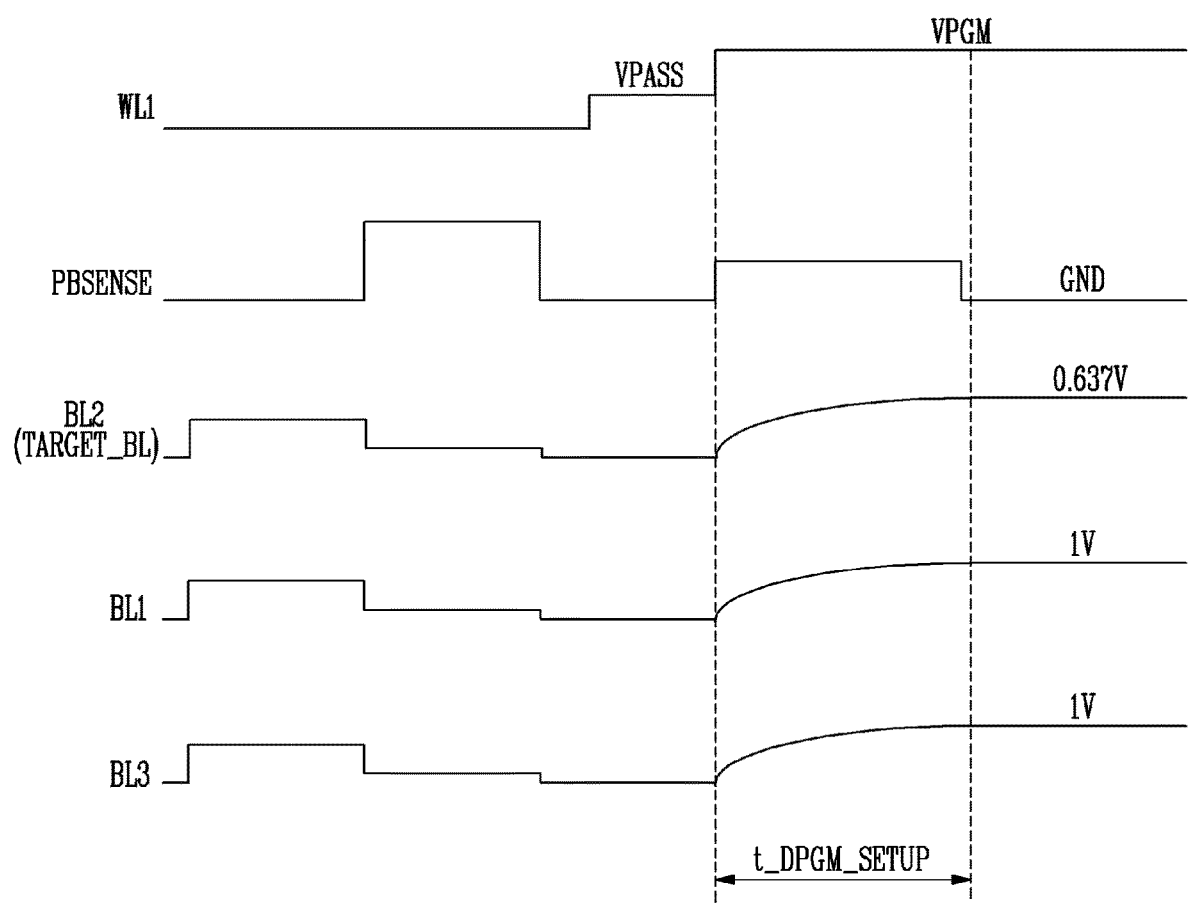
FIG. 10 is a timing diagram illustrating a voltage level of each bit line and magnitude of a signal PBSENSE during a double verify program operation of FIG. 9.

FIG. 10 is a timing diagram illustrating a voltage level of each bit line and magnitude of the signal PBSENSE during the double verify program operation DPGM of FIG. 9.

Referring to FIGS. 9 and 10, FIG. 10 illustrates a process in which a voltage level of the second bit line BL2 coupled to the second memory cell MC2 varies when the second memory cell MC2 shown in FIG. 9 is programmed.

According to an embodiment, the program voltage VPGM may be applied to the first word line WL1 coupled to the first, second, and third memory cells MC1, MC2, and MC3. In other words, the program voltage to program the first, second, and third memory cells MC1, MC2, and MC3 may be applied to the first word line WL1.

The voltage VPASS may be applied to the first word line WL1 before the program voltage VPGM is applied to the first word line WL1. That is, a level of a voltage applied to the first word line WL1 may be increased from the ground voltage GND level to the voltage VPASS level and may then be increased from the voltage VPASS level to the program voltage VPGM level.

A precharge operation for programming the first, second, and third memory cells MC1, MC2, and MC3 may be performed before the program voltage VPGM is applied to the first word line WL1. The signal PBSENSE may be in a high state for a set time during the precharge operation. A voltage level of each of the first, second, and third bit lines BL1, BL2, and BL3 may be gradually decreased from a precharge level to the ground voltage GND level.

Subsequently, the signal PBSENSE may be in a high state for the bit line set-up time t_DPGM_SETUP to program the first, second, and third memory cells MC1, MC2, and MC3 to a target program state.

According to an embodiment, because the first and third memory cells MC1 and MC3 are first program permission memory cells PGM cells, and therefore the signal PBSENSE is in a high state, a voltage level of each of the first bit line BL1 coupled to the first memory cell MC1 and the third bit line BL3 coupled to the third memory cell MC3 may be increased and then set to the ground voltage GND level.

According to an embodiment, because all of the first, second, and third memory cells MC1, MC2, and MC3 are second program permission memory cells DPGM cells, and therefore the signal PBSENSE is in a high state, a voltage level of each of the first, second, and third bit lines BL1, BL2, and BL3 coupled to MC1, MC2, and MC3, respectively, may be gradually increased to the VM level. The VM level, which is a target voltage level of the first, second, and third bit lines BL1, BL2, and BL3, may be 1V.

However, as described above with reference to FIG. 9, because the parasitic capacitance CAP3 is caused between the first and second bit lines BL1 and BL2 and the parasitic capacitance CAP4 is caused between the second and third bit lines BL2 and BL3, a speed at which the second bit line BL2 coupled to the second memory cell MC2 reaches a target voltage level may be lowered. For example, a target voltage level of the second bit line BL2 is 1V, but 0.637V may be set as a voltage level of the second bit line BL2 due to the parasitic capacitances CAP3 and CAP4.

Figure 11:
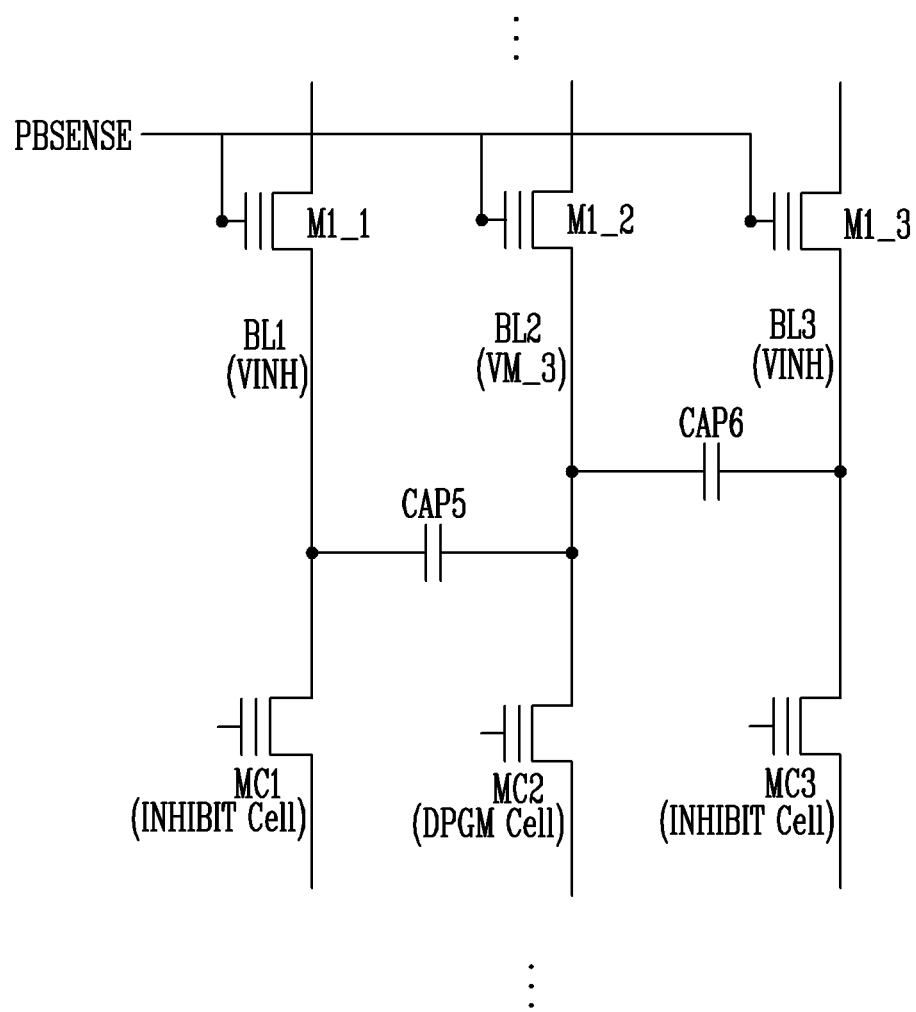
FIG. 11 is a diagram illustrating a potential of a bit line when memory cells adjacent to a memory cell on which a double verify program operation is performed are program inhibition cells.

FIG. 11 is a diagram illustrating a potential of a bit line when memory cells adjacent to a memory cell on which the double verify program operation DPGM is performed are program inhibition cells.

In FIG. 11, it is assumed that the memory device 100 shown in FIG. 2 programs the first, second, and third memory cells MC1, MC2, and MC3 among the memory cells coupled to the first word line WL1. Further, it is assumed that the first, second, and third memory cells MC1, MC2, and MC3 are programmed by a Single-Level Cell (SLC) method. A program operation performed on the first, second, and third memory cells MC1, MC2, and MC3 may be the double verify program operation DPGM.

According to an embodiment, the verify operation may be performed using the pre-verify voltage Vvfyp and the main verify voltage Vvfym after a program pulse is applied to the first word line WL1. According to a result of the verify operation, the first, second, and third memory cells MC1, MC2, and MC3 may be determined as one of the first program permission memory cells PGM cells each having a threshold voltage lower than the pre-verify voltage Vvfyp, the second program permission memory cells DPGM cells each having a threshold voltage higher than the pre-verify voltage Vvfyp and lower than the main verify voltage Vvfym, and the program inhibition memory cells INHIBIT cells each having a threshold voltage higher than the main verify voltage Vvfym.

In FIG. 11, each of the first and third memory cells MC1 and MC3 may be one of the program inhibition memory cells INHIBIT, that is, an INHIBIT cell, and the second memory cell MC2 may be one of the second program permission memory cells DPGM cells.

Accordingly, in the double verify program operation DPGM, bit line voltages of different voltage levels may be applied to the bit lines BL1, BL2, and BL3 coupled to the first, second, and third memory cells MC1, MC2, and MC3, respectively.

For example, because each of the first and third memory cells MC1 and MC3 is one of the program inhibition memory cells INHIBIT cells, and therefore a program operation on the first and third memory cells MC1 and MC3 is already completed, the program inhibition voltage VINH may be set to the first bit line BL1 coupled to the first memory cell MC1 and the third bit line BL3 coupled to the third memory cell MC3.

However, because the second memory cell MC2 is one of the second program permission memory cells DPGM cells, the VM voltage may be set to the second bit line BL2 coupled to the second memory cell MC2 to program the second memory cell MC2.

The signal PBSENSE may be applied to the gate of each of transistors M1_1, M1_2, and M1_3 to set a voltage level of each of the first, second, and third bit lines BL1, BL2, and BL3. Any of the transistors M1_1, M1_2, and M1_3 may be the first transistor M1 shown in FIG. 6, and the signal PBSENSE may be the first sense signal PBSENSE shown in FIG. 6.

According to an embodiment, parasitic capacitance CAP5 may be caused between the first and second bit lines BL1 and BL2 and parasitic capacitance CAP6 may be caused between the second and third bit lines BL2 and BL3 during a process of programming the second memory cell MC2 corresponding to the second program permission memory cells DPGM cells. In other words, because the first and third memory cells MC1 and MC3 that are adjacent to the second memory cell MC2 are program inhibition memory cells INHIBIT cells, when the second memory cell MC2 is programmed, the parasitic capacitances CAP5 and CAP6 may be caused.

Because CAP5 is caused between the first and second bit lines BL1 and BL2 and CAP6 is caused between the second and third bit lines BL2 and BL3, a speed at which the second bit line BL2 coupled to the second memory cell MC2 reaches a target voltage level may be lowered.

However, unlike the embodiments described with reference to FIGS. 7 and 9, because the first and third bit lines BL1 and BL3 adjacent to the second bit line BL2 are in a floating state, the second bit line BL2 shown in FIG. 11 may reach a target voltage level at a relatively high speed compared to the second bit line BL2 shown in FIG. 7 and at a relatively low speed compared to the second bit line BL2 shown in FIG. 9.

For example, although a target voltage level of the second bit line BL2 is 1V, 0.613V, which is lower than 1V (the target voltage level in this example), may be set as a voltage level VM_3 of the second bit line BL2 due to the parasitic capacitance CAP5 and the parasitic capacitance CAP6. However, the voltage level of the second bit line BL2 shown in FIG. 11, that is, 0.613V may be higher than the voltage level of the second bit line BL2 shown in FIG. 7, that is, 0.523V and lower than the voltage level of the second bit line BL2 shown in FIG. 9, that is, 0.637V.

As a result, referring to FIGS. 7, 9, and 11, a verify operation may be performed using the pre-verify voltage Vvfyp and the main verify voltage Vvfym after a program pulse is applied to a selected word line. Further, as a result of the verify operation, a voltage of a specific level may be set to a bit line of each of the second program permission memory cells DPGM cells each having a threshold voltage higher than the pre-verify voltage Vvfyp and lower than the main verify voltage Vvfym.

However, a time taken for a voltage level of a bit line of each of the second program permission memory cells DPGM cells to reach a target level may vary depending on whether memory cells coupled to a bit line adjacent to a bit line of each of the second program permission memory cells DPGM cells are the first program permission memory cells PGM cells, the second program permission memory cells DPGM cells, or the program inhibition memory cells INHIBIT cells.

Accordingly, because the time taken for the bit line to reach the target voltage level varies, a method of causing the second bit line BL2 to reach a target voltage level is provided in the present disclosure.

Figure 12:
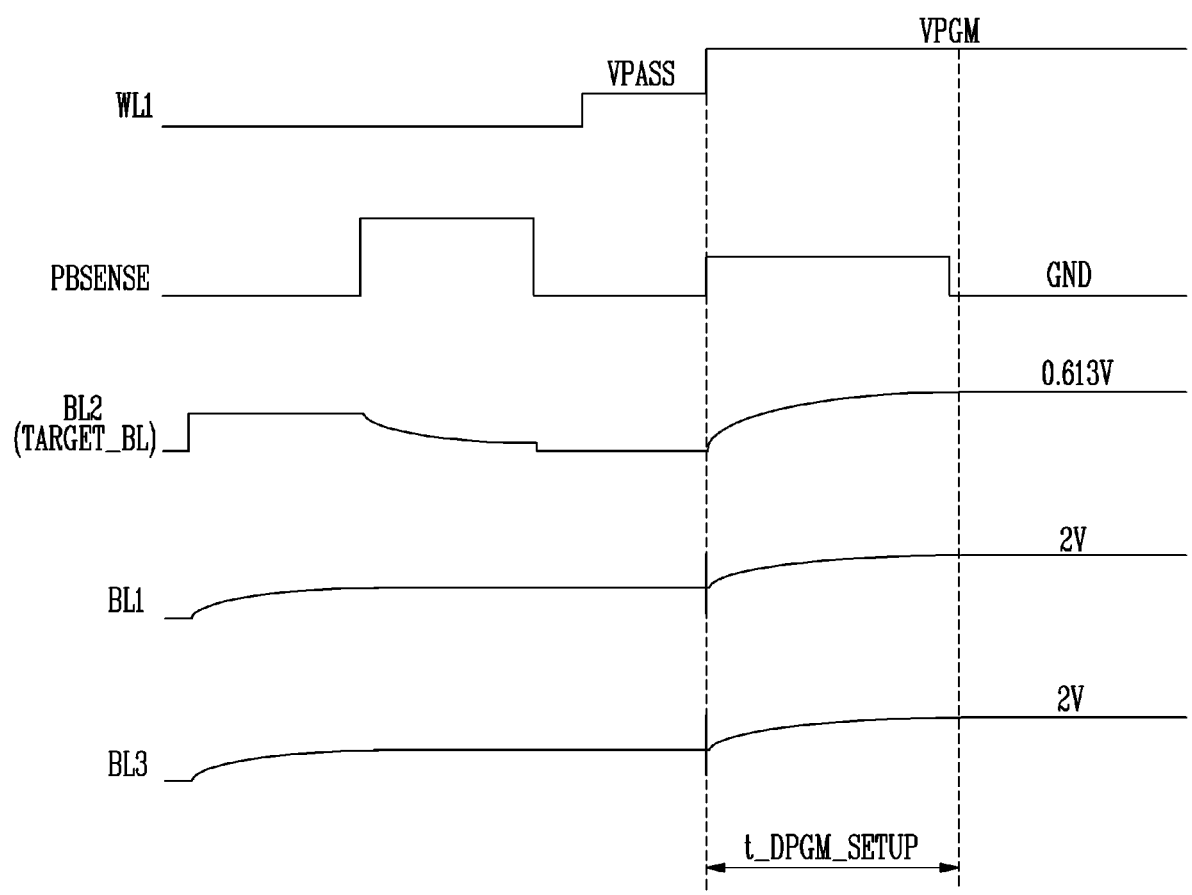
FIG. 12 is a timing diagram illustrating a voltage level of each bit line and magnitude of a signal PBSENSE during a double verify program operation of FIG. 11.

FIG. 12 is a timing diagram illustrating a voltage level of each bit line and magnitude of the signal PBSENSE during the double verify program operation of FIG. 11.

Referring to FIGS. 11 and 12, FIG. 12 illustrates a process in which a voltage level of the second bit line BL2 coupled to the second memory cell MC2 varies when the second memory cell MC2 shown in FIG. 11 is programmed.

According to an embodiment, the program voltage VPGM may be applied to the first word line WL1 coupled to the first, second, and third memory cells MC1, MC2, and MC3. In other words, the program voltage to program the first, second, and third memory cells MC1, MC2, and MC3 may be applied to the first word line WL1.

The voltage VPASS may be applied to the first word line WL1 before the program voltage VPGM is applied to the first word line WL1. That is, a level of a voltage applied to the first word line WL1 may be increased from the ground voltage GND level to the voltage VPASS level and may then be increased from the voltage VPASS level to the program voltage VPGM level.

A precharge operation for programming the second memory cell MC2 and for prohibiting a program operation on the first and third memory cells MC1 and MC3 may be performed before the program voltage VPGM is applied to the first word line WL1. The signal PBSENSE may be in a high state for a set time during the precharge operation. In addition, a voltage level of the second bit line BL2 may be gradually decreased from a precharge level to the ground voltage GND level, and a voltage level of each of the first and third bit lines BL1 and BL3 may be set to a specific voltage level before reaching the program inhibition voltage VINH level (for example, 2V).

Subsequently, the signal PBSENSE may be in a high state for the bit line set-up time t_DPGM_SETUP to program the first, second, and third memory cells MC1, MC2, and MC3 to a target program state.

According to an embodiment, because the first and third memory cells MC1 and MC3 are first program permission memory cells PGM cells, and therefore the signal PBSENSE is in a high state, a voltage level of each of the first bit line BL1 coupled to the first memory cell MC1 and the third bit line BL3 coupled to the third memory cell MC3 may be increased and then set to the ground voltage GND level.

According to an embodiment, because both first and third memory cells MC1 and MC3 are program inhibition memory cells INHIBIT cells, and therefore the signal PBSENSE is in a high state, a voltage level of each of the first and third bit lines BL1 and BL3 coupled to the first and third memory cells MC1 and MC3, respectively, may be gradually increased to 2V, which is the program inhibition voltage VINH.

However, as described above with reference to FIG. 11, because the parasitic capacitance CAP5 is caused between the first and second bit lines BL1 and BL2 and the parasitic capacitance CAP6 is caused between the second and third bit lines BL2 and BL3, a speed at which the second bit line BL2 coupled to the second memory cell MC2 reaches a target voltage level may be lowered. For example, a target voltage level of the second bit line BL2 is 1V, but 0.613V may be set as a voltage level of the second bit line BL2 due to the parasitic capacitance CAP5 and the parasitic capacitance CAP6.

Figure 13:
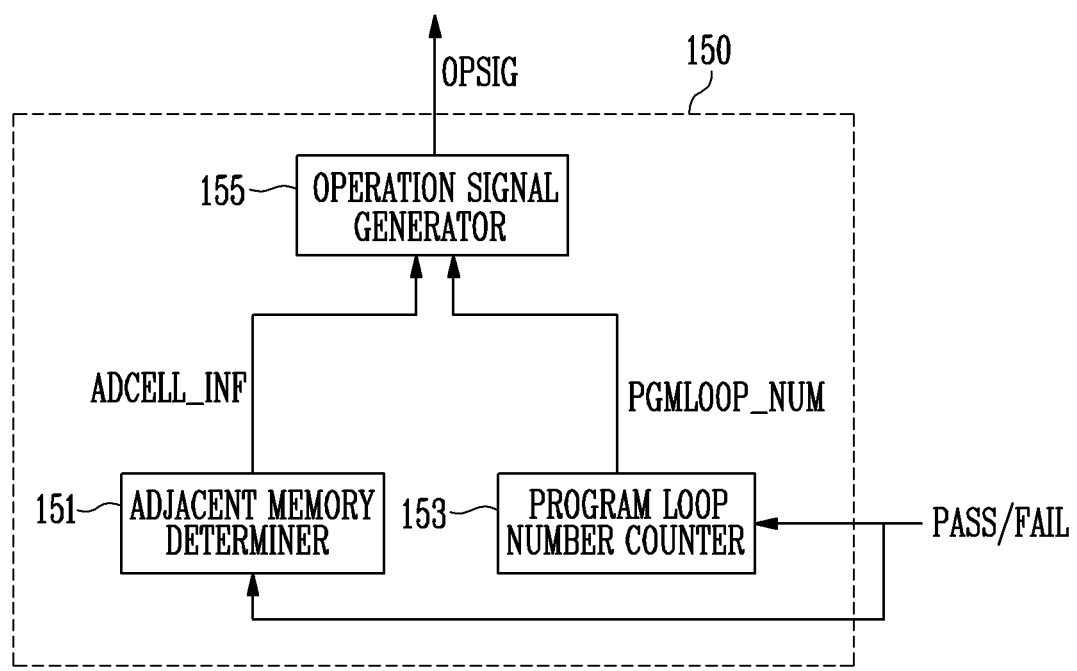
FIG. 13 is a diagram illustrating a configuration and operations of a sense signal controller shown in FIG. 1.

FIG. 13 is a diagram illustrating a configuration and operations of the sense signal controller 150 shown in FIG. 1.

Referring to FIG. 13, the sense signal controller 150 may include an adjacent memory determiner 151, a program loop number counter 153, and an operation signal generator 155.

According to an embodiment, a verify operation may be performed using the pre-verify voltage Vvfyp and the main verify voltage Vvfym. According to a result of the verify operation, a memory cell may be determined as one of the first program permission memory cells PGM cells each having a threshold voltage lower than the pre-verify voltage Vvfyp, the second program permission memory cells DPGM cells each having a threshold voltage higher than the pre-verify voltage Vvfyp and lower than the main verify voltage Vvfym, and the program inhibition memory cells INHIBIT cells each having a threshold voltage higher than the main verify voltage Vvfym.

When the memory cell is determined as one of the second program permission memory cells DPGM cells, an operation of setting the bit line set-up time t_DPGM_SETUP may be performed based on at least one of a state of memory cells adjacent to the corresponding memory cell and the number of program loops that have already been performed. In other words, when one of the second program permission memory cells DPGM cells is programmed, a time for which the signal PBSENSE is applied to the first transistor M1 shown in FIG. 6 which is coupled to the corresponding memory cell through a bit line may be set.

According to an embodiment, a verify operation may be performed using the pre-verify voltage Vvfyp and the main verify voltage Vvfym after a program pulse is applied to a selected word line, and the pass signal PASS or the fail signal FAIL may be output according to a result of the verify operation. The memory cells may be determined as the first program permission memory cells PGM cells, the second program permission memory cells DPGM cells, or the program inhibition memory cells INHIBIT cells by the verify operation using each of the verify voltages.

According to an embodiment, the adjacent memory determiner 151 may determine, based on the pass signal PASS or the fail signal FAIL, a state of the memory cells adjacent to a selected memory cell on which a program operation is performed. Each of the memory cells adjacent to the selected memory cell may be one of the first program permission memory cells PGM cells, the second program permission memory cells DPGM cells, or the program inhibition memory cells INHIBIT cells.

The adjacent memory determiner 151 may output adjacent memory cell information ADCELL_INF by determining the state of the memory cells adjacent to the selected memory cell. The adjacent memory cell information ADCELL_INF may include, depending on the state of the memory cells adjacent to the selected memory cell, information indicating the number of first program permission memory cells PGM cells, the number of second program permission memory cells DPGM cells, and the number of program inhibition memory cells INHIBIT cells.

According to an embodiment, the program loop number counter 153 may count the number of program loops that have already been performed based on the pass signal PASS or the fail signal FAIL. In the present disclosure, because the memory cells are programmed by the double verify program operation, the program loop number counter 153 may count that one program loop is performed when either the pass signal PASS or the fail signal FAIL is received twice. The program loop number counter 153 may output a number of program loops PGMLOOP_NUM that are counted.

According to an embodiment, the operation signal generator 155 may output the operation signal OPSIG instructing that a voltage for the double verify program operation may be generated. The voltage generator 122 of the memory device 100 in FIG. 2 may generate various operating voltages used to perform the double verify program operation in response to the operation signal OPSIG.

The operation signal generator 155 may generate the operation signal OPSIG based on at least one of the adjacent memory cell information ADCELL_INF output from the adjacent memory determiner 151 and the number of program loops PGMLOOP_NUM output from the program loop number counter 153.

More specifically, the operation signal generator 155 may generate the operation signal OPSIG based on the adjacent memory cell information ADCELL_INF. For example, when the adjacent memory cell information ADCELL_INF indicates that the number of first program permission memory cells PGM cells among the memory cells adjacent to the selected memory cells is greater than or equal to a first reference value, the operation signal generator 155 may output the operation signal OPSIG instructing that the first sense signal PBSENSE in FIG. 6 which maintains a high state for a time longer than a first reference time may be generated. The first program permission memory cells PGM cells may have the threshold voltage lower than the pre-verify voltage Vvfyp.

When the adjacent memory cell information ADCELL_INF indicates that the number of program inhibition memory cells INHIBIT cells each having a threshold voltage higher than the main verify voltage Vvfym among the memory cells adjacent to the selected memory cells is greater than or equal to a second reference value, the operation signal generator 155 may output the operation signal OPSIG instructing that the first sense signal PBSENSE maintaining a high state for a second reference time shorter than the first reference time may be generated.

In addition, when the adjacent memory cell information ADCELL_INF indicates that the number of second program permission memory cells DPGM cells each having a threshold voltage higher than the pre-verify voltage Vvfyp and lower than the main verify voltage Vvfym among the memory cells adjacent to the selected memory cells is greater than or equal to a third reference value, the operation signal generator 155 may output the operation signal OPSIG instructing that the first sense signal PBSENSE maintaining a high state for a third reference time shorter than the second reference time may be generated.

As a result, when the number of first program permission memory cells PGM cells among the memory cells adjacent to the selected memory cells increases, a time for which the first sense signal PBSENSE maintains a high state increases; and, when the number of second program permission memory cells DPGM cells among the memory cells adjacent to the selected memory cells increases, a time for which the first sense signal PBSENSE maintains the high state decreases.

According to an embodiment, the operation signal generator 155 may generate the operation signal OPSIG based on the number of program loops PGMLOOP_NUM output from the program loop number counter 153. For example, when the number of program loops that have already been performed is smaller, the operation signal generator 155 may output the operation signal OPSIG instructing that the first sense signal PBSENSE, which maintains a high state for a time longer than a reference time, may be generated.

For example, the small number of program loops that have already been performed may mean that the number of memory cells that are completely programmed is small. In other words, the small number of program loops that have already been performed may mean that the number of first program permission memory cells PGM cells each having a threshold voltage lower than the pre-verify voltage Vvfyp among the memory cells adjacent to the selected memory cell is great.

Alternatively, that many program loops that have already been performed may mean that the number of memory cells that are completely programmed is great. In other words, that many program loops that have already been performed may mean that the number of program inhibition memory cells INHIBIT cells having a threshold voltage higher than the main verify voltage Vvfym among the memory cells adjacent to the selected memory cell is great.

Accordingly, the operation signal generator 155 may control a time for which the first sense signal PBSENSE in a high state is generated based on the number of program loops PGMLOOP_NUM.

According to an embodiment, the operation signal generator 155 may control a time for which the first sense signal PBSENSE is generated based on both the adjacent memory cell information ADCELL_INF and the number of program loops PGMLOOP_NUM. In other words, the operation signal generator 155 may control a time for which the first sense signal PBSENSE is generated based on a state of the memory cells adjacent to the selected memory cell and the number of program loops that have already been performed.

More specifically, the operation signal generator 155 may set a time for which the first sense signal PBSENSE is generated by reflecting the adjacent memory cell information ADCELL_INF and may then correct the set time by reflecting the number of program loops PGMLOOP_NUM. Alternatively, the operation signal generator 155 may set a time for which the first sense signal PBSENSE is generated based on the number of program loops PGMLOOP_NUM and may then correct the set time based on the adjacent memory cell information ADCELL_INF.

Figure 14:
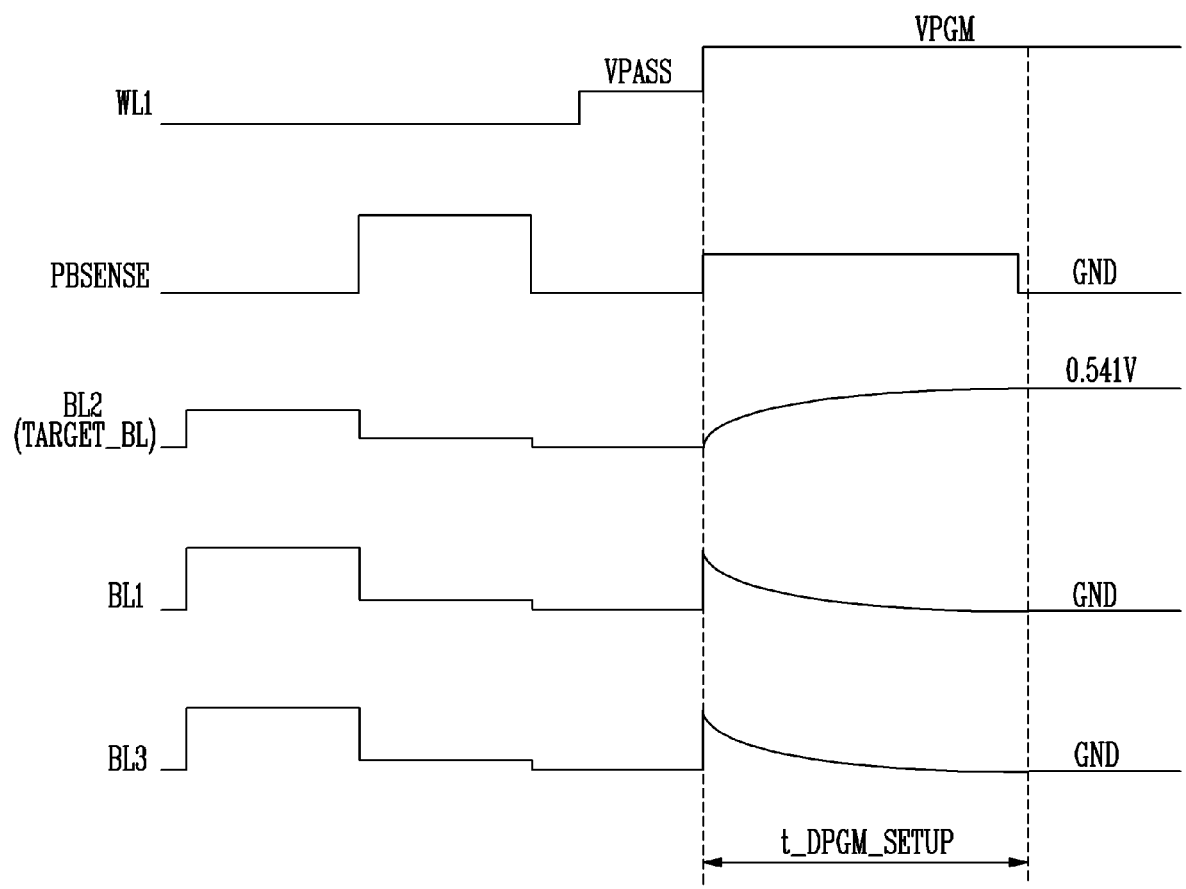
FIG. 14 is a timing diagram illustrating a voltage level of each bit line and magnitude of a signal PBSENSE when a sense signal is applied for a set-up time set based on adjacent memory cell information.

FIG. 14 is a timing diagram illustrating a voltage level of each bit line and magnitude of the signal PBSENSE when a sense signal is applied for a set-up time set based on adjacent memory cell information.

FIG. 14 illustrates a voltage level to which the second bit line BL2 is set when the bit line set-up time t_DPGM_SETUP is set to be longer than the bit line set-up time t_DPGM_SETUP shown in FIG. 8. In other words, FIG. 14 illustrates the voltage level to which the second bit line BL2 is set when the first sense signal PBSENSE is applied for the bit line set-up time t_DPGM_SETUP set based on the adjacent memory cell information ADCELL_INF.

Features in FIG. 14 that are the same as or similar to those described with reference to FIG. 8 are not described again here.

According to an embodiment, when the adjacent memory cell information ADCELL_INF indicates that the number of first program permission memory cells PGM cells among the memory cells adjacent to the selected memory cells is greater than or equal to the first reference value, the operation signal generator 155 in FIG. 13 may output the operation signal OPSIG instructing that the first sense signal PBSENSE maintaining a high state for a time longer than the first reference time may be generated.

Subsequently, the voltage generator 122 in FIG. 2 may generate the first sense signal PBSENSE maintaining a high state for a time longer than the first reference time based on the operation signal OPSIG.

Referring to FIG. 14, when the first sense signal PBSENSE maintaining the high state for the time longer than the first reference time is generated, the voltage level of the second bit line BL2 may reach 0.541V. Accordingly, a voltage level higher than 0.523V, that is, the second bit line BL2 in FIG. 14 may be set to same voltage level as the second bit line BL2 in FIG. 8.

However, the voltage level of the second bit line BL2 in FIG. 14 might not reach its target voltage level, that is, 1V. Accordingly, the bit line set-up time t_DPGM_SETUP may need to be adjusted considering the number of program loops that have already been performed.

Figure 15:
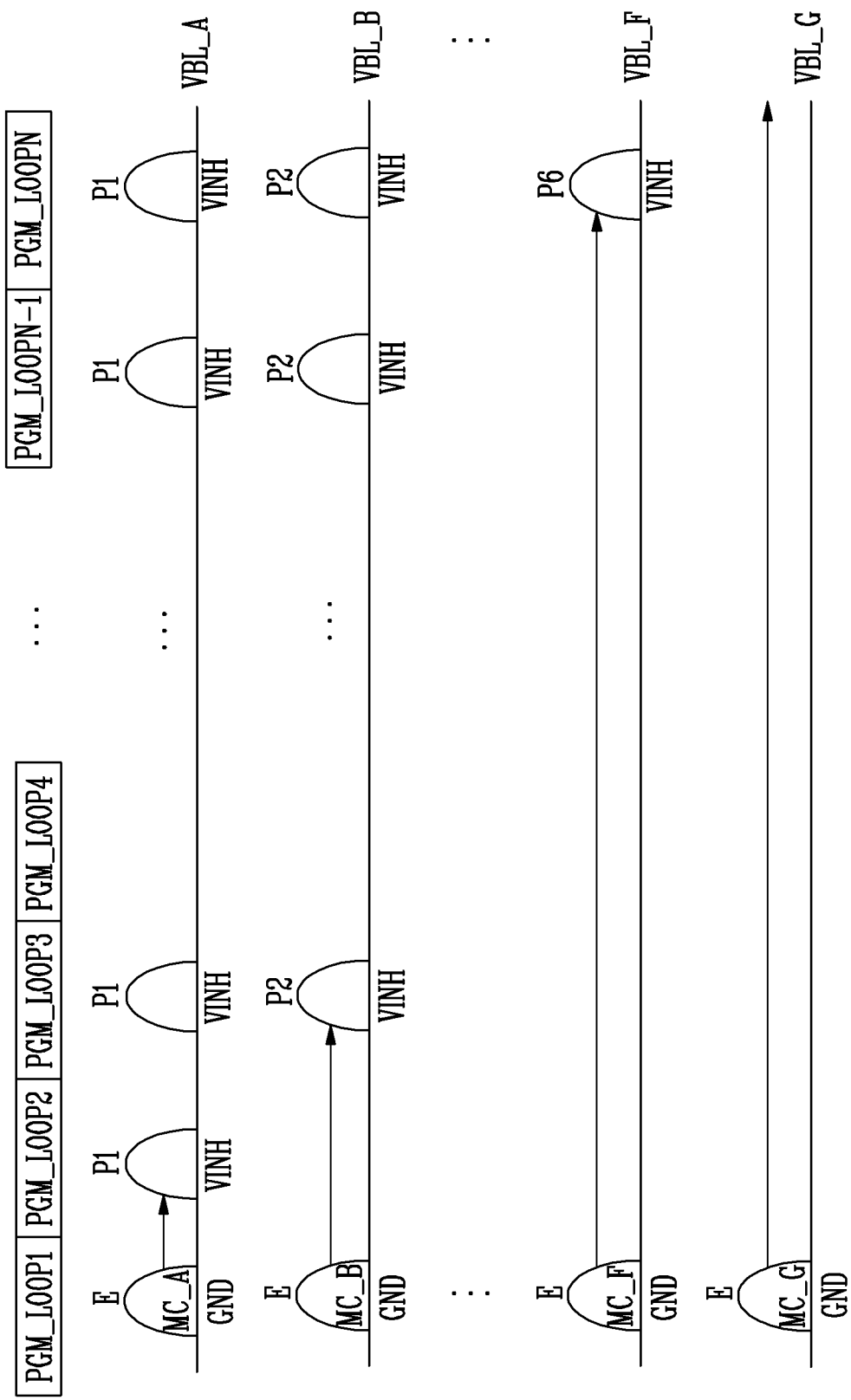
FIG. 15 is a diagram illustrating a process of performing a program loop.

FIG. 15 is a diagram illustrating a process of performing a program loop.

Referring to FIG. 15, a plurality of program loops PGM_LOOP1 to PGM_LOOPN are performed during a program operation that is performed on selected memory cells. Each of the plurality of program loops PGM_LOOP1 to PGM_LOOPN may include a program pulse applying operation and a verify operation. The verify operation may be performed using the pre-verify voltage Vvfyp and the main verify voltage Vvfym. That is, each of the plurality of program loops PGM_LOOP1 to PGM_LOOPN may correspond to a double verify program operation.

In FIG. 15, by way of example, it is assumed that memory cells are programmed from the erase state E to one of first to seventh program states P1 to P7. In other words, the memory cells may be programmed by a Triple-Level Cell (TLC) method.

However, the programming described with reference to FIG. 15 may be applied by other methods, including a Single-Level Cell (SLC) method, a Multi-Level Cell (MLC) method, or a Quadruple-Level Cell (QLC) method.

According to an embodiment, among the selected memory cells to which the program operation is performed, memory cells MC_A may be programmed to the first program state P1, memory cells MC_B to the second program state P2, memory cells MC_C to the third program state P3, memory cells MC_D to the fourth program state P4, memory cells MC_E to the fifth program state P5, memory cells MC_F to the sixth program state P6, and memory cells MC_G to the seventh program state P7. When the program operation is permitted, a voltage of a bit line coupled to each of memory cells MC_A to MC_F may be set to the ground voltage GND or the VM voltage, for example, 1V.

According to an embodiment, it is assumed that all the memory cells MC_A are programmed to the first program state P1 in the first program loop PGM_LOOP1. Accordingly, a program operation on the memory cells MC_A may be inhibited from the second program loop PGM_LOOP2. Accordingly, from the second program loop PGM_LOOP2, a voltage level of a bit line VBL_A coupled to each of the memory cells MC_A may be set to the program inhibition voltage VINH level.

Similarly, all the memory cells MC_B may be programmed to the second program state P2 in the second program loop PGM_LOOP2, and a program operation on the memory cells MC_B may be inhibited from the third program loop PGM_LOOP3. Accordingly, from the third program loop PGM_LOOP3, a voltage level of a bit line VBL_B coupled to each of the memory cells MC_B may be set to the program inhibition voltage VINH level.

In addition, all the memory cells MC_F may be programmed to the sixth program state P6 in the (N−1)th program loop PGM_LOOPN−1, and a program operation on the memory cells MC_F may be inhibited from the Nth program loop PGM_LOOPN. Accordingly, from the Nth program loop PGM_LOOPN, a voltage level of a bit line VBL_F coupled to each of the memory cells MC_F may be set to the program inhibition voltage VINH level. All the memory cells MC_G may be programmed to the seventh program state P7 in the Nth program loop PGM_LOOPN and a program loop may then be finished.

According to an embodiment, there may be N program loops, i.e., PGM_LOOP1 to PGM_LOOPN, where N is any suitable number of 2 or more.

According to an embodiment, as the program loops proceed from the first program loop PGM_LOOP1 to the Nth program loop PGM_LOOPN, the number of memory cells on which a program operation is inhibited may be increased. Accordingly, as more program loops are performed, an offset time of the bit line set-up time t_DPGM_SETUP may be decreased. In other words, when the number of program loops increases, the number of memory cells that have passed the verify operation may increase. Therefore, when the number of program loops increases, the bit line set-up time t_DPGM_SETUP may decrease, or the amount by which t_DPGM_SETUP was previously increased is decreased.

As a result, when one memory cell, among the second program permission memory cells DPGM cells, having a threshold voltage higher than the pre-verify voltage Vvfyp and lower than the main verify voltage Vvfym, is programmed, as program loops proceed, the number of the program inhibition memory cells INHIBIT cells, among memory cells adjacent to the one memory cell that is programmed, may increase, and therefore, an increased amount in the bit line set-up time t_DPGM_SETUP may decrease.

FIGS. 16A to 16C are diagrams illustrating a set-up time set based on adjacent memory cell information and/or the number of program loops.

FIGS. 16A to 16C illustrate the bit line set-up time t_DPGM_SETUP that is set when one of the second program permission memory cells DPGM cells having a threshold voltage higher than the pre-verify voltage Vvfyp and lower than the main verify voltage Vvfym is programmed.

More specifically, FIG. 16A illustrates that the bit line set-up time t_DPGM_SETUP is set based on, when one of the second program permission memory cells DPGM cells is programmed, the number of first program permission memory cells PGM_NUM among memory cells adjacent to the one memory cell that is programmed. FIG. 16B illustrates that the bit line set-up time t_DPGM_SETUP is set based on, when one of the second program permission memory cells DPGM cells is programmed, the number of program loops PGMLOOP_NUM that have already been performed when one of the second program permission memory cells DPGM cells is programmed. FIG. 16C illustrates that the bit line set-up time t_DPGM_SETUP is set based on, when one of the second program permission memory cells DPGM cells is programmed, both the number of first program permission memory cells PGM_NUM among memory cells adjacent to the one memory cell that is programmed and the number of program loops PGMLOOP_NUM that have already been performed.

According to another embodiment, the bit line set-up time t_DPGM_SETUP may be set based on, among memory cells adjacent to one memory cell that is programmed, the number of second program permission memory cells DPGM_NUM or the number of program inhibition memory cells INHIBIT_NUM, but not the number of first program permission memory cells PGM_NUM.

Referring to FIG. 16A, the number of first program permission memory cells PGM_NUM, among memory cells adjacent to a selected memory cell on which a program operation is performed, may belong to one of multiple ranges, e.g., one of three ranges in the illustrated embodiment.

In FIG. 16A, when the number of first program permission memory cells PGM_NUM is less than N11, a plurality of programmed memory cells may exist among selected memory cells coupled to a selected word line. Accordingly, a first offset time t_OFFSET1 might not be set and the bit line set-up time t_DPGM_SETUP may be set to a reference time tREF. When the bit line set-up time t_DPGM_SETUP is set to the reference time tREF, the first sense signal PBSENSE in a high state may be generated for the reference time tREF.

When the number of first program permission memory cells PGM_NUM is greater than or equal to N11 and is less than N12, there may exist some memory cells that do not reach a target program state among the selected memory cells coupled to the selected word line. Accordingly, the first offset time t_OFFSET1 may be set to t12 and the bit line set-up time t_DPGM_SETUP may be set to a time longer than the reference time tREF by t12, that is, tREF+t12.

When the bit line set-up time t_DPGM_SETUP is set, the first sense signal PBSENSE in a high state may be generated for the time tREF+t12.

When the number of first program permission memory cells PGM_NUM is greater than or equal to N12, most of the selected memory cells coupled to the selected word line might not reach the target program state. Accordingly, the first offset time t_OFFSET1 may be set to t13 longer than t12 and the bit line set-up time t_DPGM_SETUP may be set to a time longer than the reference time tREF by t13, that is, tREF+t13. When the bit line set-up time t_DPGM_SETUP is set, the first sense signal PBSENSE in a high state may be generated for the time tREF+t13.

Referring to FIG. 16B, the number of program loops PGMLOOP_NUM that have already been performed on the selected memory cell to which the program operation is performed may belong to one of multiple ranges, e.g., one of three ranges in the illustrated embodiment.

In FIG. 16B, when the number of program loops PGMLOOP_NUM that have already been performed is less than N21, most of the selected memory cells coupled to the selected word line might not reach the target program state. Accordingly, a second offset time t_OFFSET2 may be set to t21 and the bit line set-up time t_DPGM_SETUP may be set to a time longer than the reference time tREF by t21, that is, tREF+t21. When the bit line set-up time t_DPGM_SETUP is set, the first sense signal PBSENSE in a high state may be generated for the time tREF+t21.

When the number of program loops PGMLOOP_NUM that have already been performed is greater than or equal to N21 and is less than N22, there may exist some memory cells that do not reach the target program state among the selected memory cells coupled to the selected word line. Accordingly, the second offset time t_OFFSET2 may be set to t22 shorter than t21 and the bit line set-up time t_DPGM__SETUP may be set to a time longer than the reference time tREF by t22, that is, tREF+t22. When the bit line set-up time t_DPGM_SETUP is set, the first sense signal PBSENSE in a high state may be generated for the time tREF+t22.

When the number of program loops PGMLOOP_NUM that have already been performed is greater than or equal to N22, a plurality of programmed memory cells may exist among the selected memory cells coupled to the selected word line. Accordingly, the second offset time t_OFFSET2 might not be set and the bit line set-up time t_DPGM__SETUP may be set to the reference time tREF. When the bit line set-up time t_DPGM_SETUP is set to the reference time tREF, the first sense signal PBSENSE in a high state may be generated for the reference time tREF.

Referring to FIG. 16C, the bit line set-up time t_DPGM__SETUP may be set based on both the number of first program permission memory cells PGM_NUM among the memory cells adjacent to the programmed memory cell and the number of program loops PGMLOOP_NUM that have already been performed.

In FIG. 16C, it is assumed that the number of first program permission memory cells PGM_NUM among the memory cells adjacent to the programmed memory cell belongs to a range greater than or equal to N11 and less than N12 and the number of program loops PGMLOOP_NUM that have already been performed belongs to a range less than N21. That is, FIG. 16C may illustrate a case where some of the memory cells adjacent to the programmed memory cell are programmed, but the number of program loops that have already been performed is small.

According to an embodiment, the first offset time t_OFFSET1 may be set to t12 based on the number of first program permission memory cells PGM_NUM and the second offset time t_OFFSET2 may be set to t21 based on the number of program loops PGMLOOP_NUM that have already been performed. Accordingly, the bit line set-up time t_DPGM_SETUP may be set to a time longer than the reference time tREF by t12+t21, that is, tREF+t12+t21. When the bit line set-up time t_DPGM_SETUP is set, the first sense signal PBSENSE in a high state may be generated for the time tREF+t12+t21.

Figure 17:
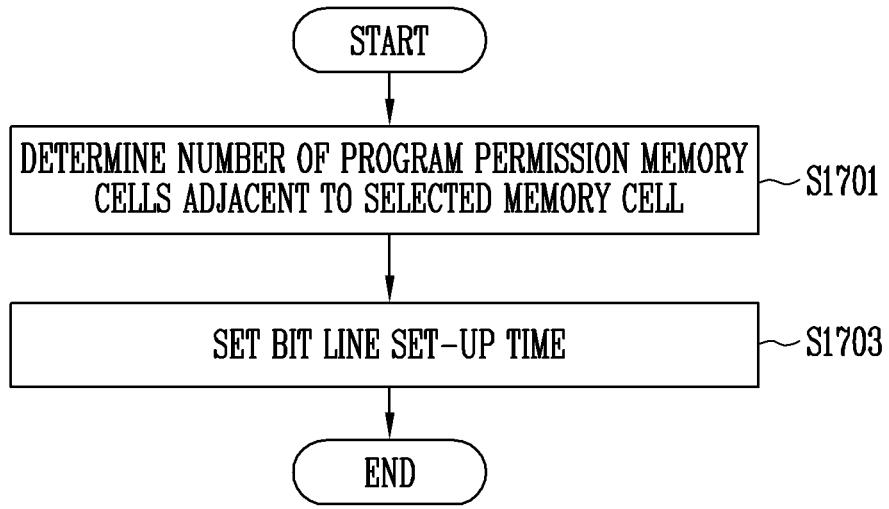
FIG. 17 is a diagram illustrating operations of a memory device according to an embodiment of the present disclosure.

FIG. 17 is a diagram illustrating operations of a memory device according to an embodiment of the present disclosure.

Referring to FIG. 17, at operation S1701, the memory device may determine the number of program permission memory cells adjacent to a selected memory cell. The selected memory cell may be one of multiple memory cells having a threshold voltage higher than the pre-verify voltage Vvfyp and lower than the main verify voltage Vvfym during the double verify program operation DPGM. In addition, the number of program permission memory cells may refer to the number of memory cells having a threshold voltage lower than the pre-verify voltage Vvfyp.

According to an embodiment, during a program operation on the selected memory cell, parasitic capacitance may be caused between a bit line coupled to the selected memory cell and each of bit lines adjacent to the bit line coupled to the selected memory cell, and a voltage level of the bit line coupled to the selected memory cell might not reach a target level due to the parasitic capacitance. Accordingly, the memory device may determine a state of memory cells adjacent to the selected memory cell such that the voltage level of the bit line coupled to the selected memory cell reaches the target level.

At operation S1703, the memory device may set a bit line set-up time based on a state of the memory cells adjacent to the selected memory cell. The bit line set-up time may refer to a time for which a signal is applied to a gate of a transistor coupled to a bit line among transistors in a page buffer.

According to an embodiment, each of the memory cells adjacent to the selected memory cell may have a threshold voltage lower than the pre-verify voltage Vvfyp, a threshold voltage higher than the pre-verify voltage Vvfyp and lower than the main verify voltage Vvfym, or a threshold voltage higher than the main verify voltage Vvfym.

When the number of memory cells having a threshold voltage lower than the pre-verify voltage Vvfyp among the memory cells adjacent to the selected memory cell is greater than the number of memory cells having a threshold voltage higher than the pre-verify voltage Vvfyp and lower than the main verify voltage Vvfym, or a threshold voltage higher than the main verify voltage Vvfy, the memory device may set the bit line set-up time to longer than a reference time. Alternatively, when the number of memory cells having a threshold voltage lower than the pre-verify voltage Vvfyp among the memory cells adjacent to the selected memory cell is smaller than the number of memory cells having a threshold voltage higher than the pre-verify voltage Vvfyp and lower than the main verify voltage Vvfym, or a threshold voltage higher than the main verify voltage Vvfy, the memory device may set the bit line set-up time to longer than the reference time.

According to an embodiment, the bit line set-up time may be corrected based on the number of program loops that have already been performed after the bit line set-up time is set based on the state of the adjacent memory cells. In other words, the bit line set-up time may be set based on both the number of program loops performed on the selected memory cell and the state of the memory cells adjacent to the selected memory cell.

Accordingly, after the bit line set-up time is set based on the state of the adjacent memory cells, when the number of program loops that have already been performed decreases, the memory device may increase the bit line set-up time. Alternatively, when the number of program loops that have already been performed increases, the memory device may increase the bit line set-up time still less than that of a case where the number of program loops that have already been performed is smaller.

Figure 18:
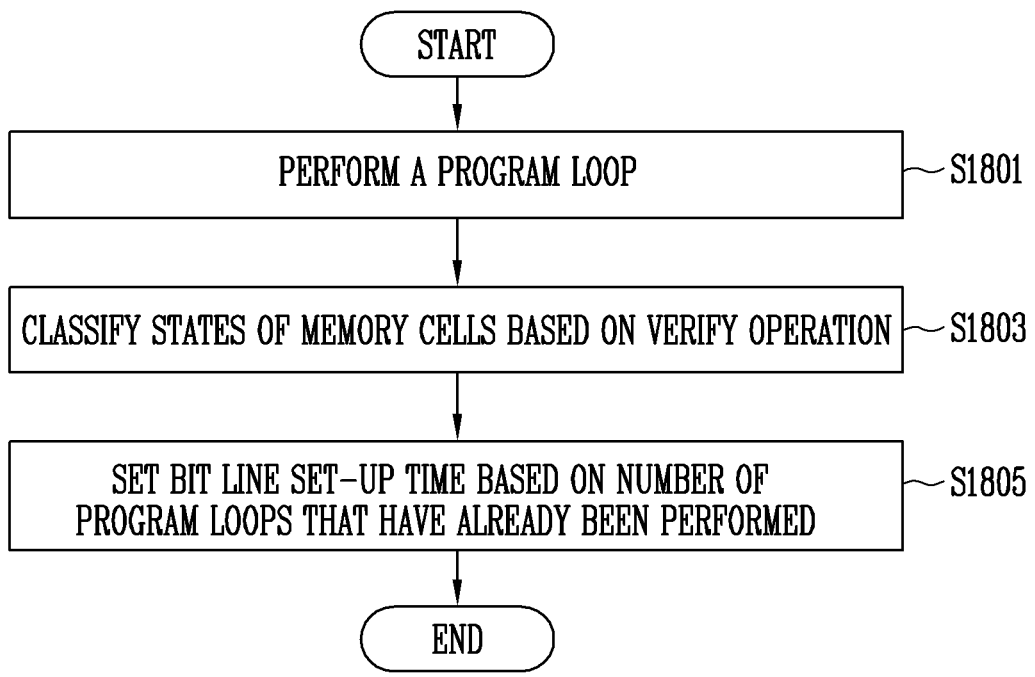
FIG. 18 is a diagram illustrating operations of a memory device according to an embodiment of the present disclosure.

FIG. 18 is a diagram illustrating operations of a memory device according to an embodiment of the present disclosure.

Referring to FIG. 18, at operation S1801, the memory device may perform a program loop. The program loop may include a program pulse applying operation and a verify operation. The verify operation may be performed using the pre-verify voltage Vvfyp and the main verify voltage Vvfym. That is, the program loop may correspond to a double verify program operation.

At operation S1803, the memory device may classify each of the memory cells on which a program operation is performed as one of multiple states based on the verify operation. For example, during the verify operation, each of the memory cells may be classified as one of the first program permission memory cells PGM cells, one of the second program permission memory cells DPGM cells, or one of the program inhibition memory cells INHIBIT cells. The first program permission memory cells PGM cells each have a threshold voltage lower than the pre-verify voltage Vvfyp. The second program permission memory cells DPGM cells each have a threshold voltage higher than the pre-verify voltage Vvfyp and lower than the main verify voltage Vvfym. The program inhibition memory cells INHIBIT cells each have a threshold voltage higher than the main verify voltage Vvfym.

At operation S1805, the memory device may set a bit line set-up time based on the number of program loops that have already been performed. More specifically, during the program operation on the second program permission memory cells DPGM cells, each having a threshold voltage higher than the pre-verify voltage Vvfyp and lower than the main verify voltage Vvfym among the memory cells classified at operation S1803, when the number of program loops that have already been performed is smaller than the number of program loops that have not been performed, the memory device may set the bit line set-up time of a bit line coupled to the corresponding memory cell to be longer than the reference time. Alternatively, when the number of program loops that have already been performed is greater, the memory device may set the bit line set-up time of the bit line coupled to the corresponding memory cell to be longer than the reference time but to be shorter than that of a case where the number of program loops that have already been performed is smaller.

According to an embodiment, the bit line set-up time may be corrected based on the state of the adjacent memory cells, after the bit line set-up time is set based on the number of program loops that have already been performed. In other words, the bit line set-up time may be set based on both the number of program loops performed on the selected memory cell and the state of the memory cells adjacent to the selected memory cell.

Accordingly, after the bit line set-up time is set based on the number of program loops that have already been performed, when the number of program permission memory cells among the adjacent memory cells increases, the memory device may increase the bit line set-up time. Alternatively, when the number of program permission memory cells among the adjacent memory cells decreases, the memory device may increase the bit line set-up time but still keep such time shorter than that according to a case where the number of program permission memory cells is greater.

Figure 19:
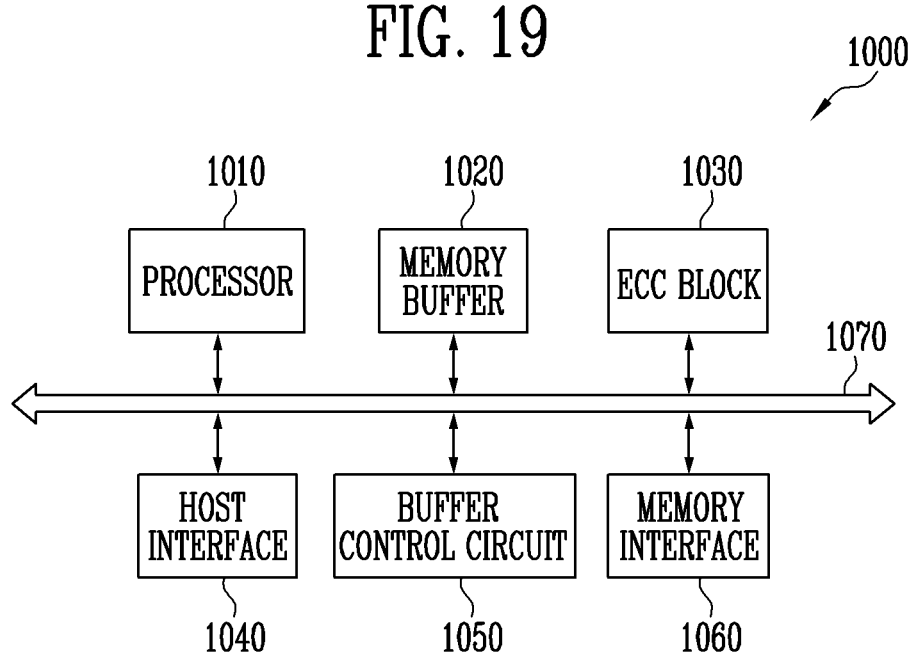
FIG. 19 is a diagram illustrating another embodiment of a memory controller shown in FIG. 1.

FIG. 19 is a diagram illustrating another embodiment of a memory controller shown in FIG. 1.

A memory controller 1000 may be coupled to a host and a memory device. In response to a request from the host, the memory controller 1000 may access the memory device. For example, the memory controller 1000 may control write, read, erase, and background operations of the memory device. The memory controller 1000 may provide an interface between the memory device and the host. The memory controller 1000 may run firmware for controlling the memory device.

Referring to FIG. 19, the memory controller 1000 may include a processor 1010, a memory buffer 1020, an error correction code (ECC) block 1030, a host interface 1040, a buffer control circuit 1050, a memory interface 1060, and a bus 1070.

The bus 1070 may provide a channel between components of the memory controller 1000.

The processor 1010 may control overall operation of the memory controller 1000 and may perform a logical operation. The processor 1010 may communicate with an external host through the host interface 1040 and communicate with the memory device through the memory interface 1060. Further, the processor 1010 may communicate with the memory buffer 1020 through the buffer control circuit 1050. The processor 1010 may control operations of a storage device by using the memory buffer 1020 as operational memory, cache memory or buffer memory.

The processor 1010 may perform a function of a flash translation layer (FTL). The processor 1010 may translate a logical block address (LBA), provided by the host, into a physical block address (PBA) through the FTL. The FTL may receive the LBA and translate the LBA into the PBA by using a mapping table. There are various address mapping methods for the FTL, depending on a mapping unit. Typical address mapping methods include a page mapping method, a block mapping method and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

According to an embodiment, the processor 1010 may run software or firmware to perform randomizing and derandomizing operations.

The memory buffer 1020 may serve as operational memory, cache memory, or buffer memory of the processor 1010. The memory buffer 1020 may store codes and commands executed by the processor 1010. The memory buffer 1020 may store data that is processed by the processor 1010. The memory buffer 1020 may include Static RAM (SRAM) or Dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data received from the memory device through the memory interface 1060. For example, the ECC block 1030 may be included as the component of, and disposed in, the memory interface 1060.

The host interface 1040 may communicate with the external host under control of the processor 1010. The host interface 1040 may perform communication using at least one of various communication methods such as a Universal Serial Bus (USB), Serial AT Attachment (SATA), a Serial Attached SCSI (SAS), a High Speed Interchip (HSIC), a Small Computer System Interface (SCSI), a Peripheral Component Interconnection (PCI), PCI express (PCIe), NonVolatile Memory express (NVMe), Universal Flash Storage (UFS), Secure Digital (SD), a Multi-Media Card (MMC), an embedded MMC (eMMC), a Dual In-line Memory Module (DIMM), a Registered DIMM (RDIMM), and/or a Load Reduced DIMM (LRDIMM).

The buffer control circuit 1050 may control the memory buffer 1020 under the control of the processor 1010.

The memory interface 1060 may communicate with the memory device under the control of the processor 1010. The memory interface 1060 may communicate commands, addresses, and data with the memory device through channels.

The memory controller 1000 does not necessarily include the memory buffer 1020 and the buffer control circuit 1050 in all embodiments. These components may be external to the memory controller 1000.

For example, the processor 1010 may control the operations of the memory controller 1000 using codes. The processor 1010 may load codes from a nonvolatile memory device (e.g., Read Only Memory (ROM)) provided in the memory controller 1000. In another example, the processor 1010 may load codes from the memory device through the memory interface 1060.

For example, the bus 1070 of the memory controller 1000 may have two types of buses: a control bus and a data bus. The data bus may be configured to transfer data in the memory controller 1000, and the control bus may be configured to transfer control information such as commands and addresses in the memory controller 1000. The data bus and the control bus may be isolated from each other so as not to interfere with, nor influence, each other. The data bus may be coupled to the host interface 1040, the buffer control circuit 1050, the ECC block 1030, and the memory interface 1060. The control bus may be coupled to the host interface 1040, the processor 1010, the buffer control circuit 1050, the memory buffer 1020, and the memory interface 1060.

Figure 20:
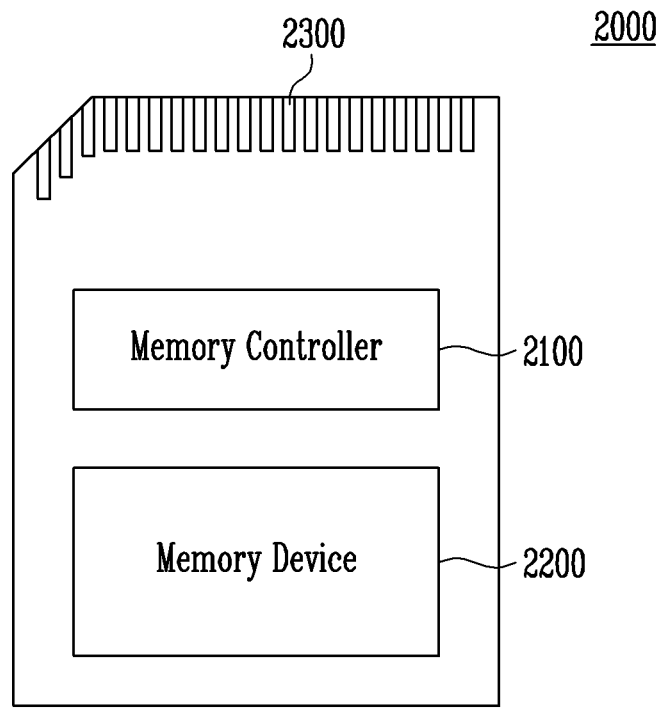
FIG. 20 is a block diagram illustrating a memory card system to which a storage device is applied according to an embodiment of the present disclosure.

FIG. 20 is a block diagram illustrating a memory card system 2000 to which a storage device is applied according to an embodiment of the present disclosure.

Referring to FIG. 20, the memory card system 2000 may include a memory controller 2100, a memory device 2200 and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and the host. The memory controller 2100 may drive firmware for controlling the memory device 2200. The memory device 2200 may be configured in the same manner as the memory device 100 of FIG. 1.

For example, the memory controller 2100 may include components, such as Random Access Memory (RAM), a processor, a host interface, a memory interface, and an ECC block.

The memory controller 2100 may communicate with an external device through the connector 2300. The memory controller 2100 may communicate with an external device (e.g., a host) based on a specific communication protocol. For example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), PCI express (PCIe), Advanced Technology Attachment (ATA), Serial-ATA (SATA), Parallel-ATA (PATA), a Small Computer System Interface (SCSI), an enhanced small disk interface (ESDI), Integrated Drive Electronics (IDE), Firewire, Universal Flash Storage (UFS), WiFi, Bluetooth, and/or nonvolatile memory express (NVMe). For example, the connector 2300 may be defined by at least one of the above-described various communication protocols.

In an embodiment, the memory device 2200 may be embodied as any of various nonvolatile memory devices, such as Electrically Erasable and Programmable ROM (EEPROM), NAND flash memory, NOR flash memory, Phase-change RAM (PRAM), Resistive RAM (ReRAM), Ferroelectric RAM (FRAM), and/or Spin-Transfer Torque Magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (e.g., SM or SMC), a memory stick, a multimedia card (e.g., MMC, RS-MMC, MMCmicro, or eMMC), a secure digital (SD) card (e.g., SD, miniSD, microSD, or SDHC), and/or universal flash storage (UFS).

Figure 21:
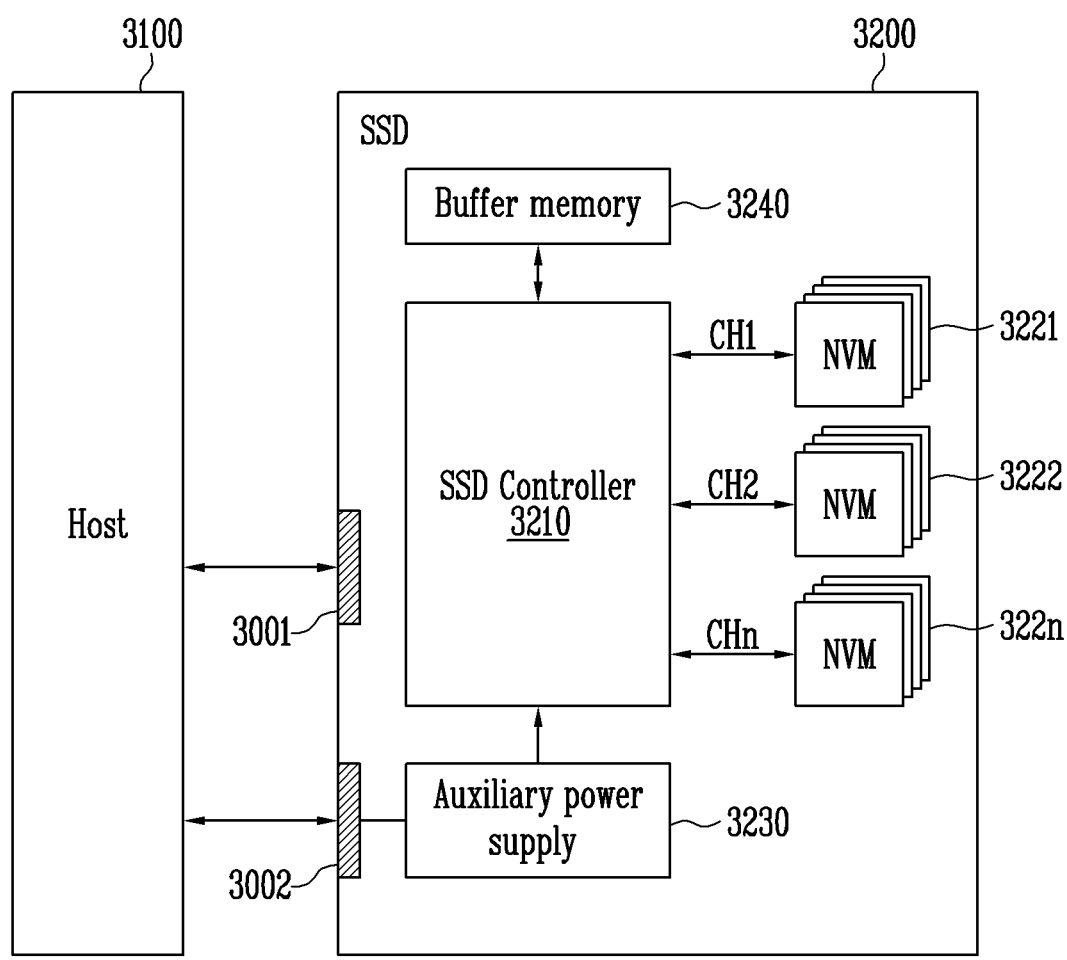
FIG. 21 is a block diagram illustrating an example of a solid state drive (SSD) system to which a storage device is applied according to an embodiment of the present disclosure.

FIG. 21 is a block diagram illustrating an example of a solid state drive (SSD) system 3000 to which a storage device is applied according to an embodiment of the present disclosure.

Referring to FIG. 21, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memory 3221 to 322n, an auxiliary power supply 3230, and buffer memory 3240.

In an embodiment, the SSD controller 3210 may perform the function of the memory controller 200 of FIG. 1.

The SSD controller 3210 may control the plurality of flash memory 3221 to 322n in response to the signals SIG received from the host 3100. For example, the signals SIG may be based on the interfaces of the host 3100 and the SSD 3200. For example, the signals SIG may be defined by at least one of various interfaces such as a Universal Serial Bus (USB), a Multi-Media Card (MMC), an embedded MMC (eMMC), a peripheral component interconnection (PCI), PCI-express (PCI-e), Advanced Technology Attachment (ATA), Serial-ATA (SATA), Parallel-ATA (PATA), a Small Computer System Interface (SCSI), an enhanced small disk interface (ESDI), Integrated Drive Electronics (IDE), Firewire, Universal Flash Storage (UFS), WiFi, Bluetooth, and/or nonvolatile memory express (NVMe).

The auxiliary power supply 3230 may be coupled to the host 3100 through the power connector 3002. The auxiliary power supply 3230 may be charged with the power PWR supplied from the host 3100. The auxiliary power supply 3230 may supply power of the SSD 3200 when power is not smoothly supplied from the host 3100. For example, the auxiliary power supply 3230 may be disposed within or external to the SSD 3200. For example, the auxiliary power supply 3230 may be disposed on a main board and may supply auxiliary power to the SSD 3200.

The buffer memory 3240 may function as buffer memory of the SSD 3200. For example, the buffer memory 3240 may temporarily store data received from the host 3100 or data received from the plurality of flash memory 3221 to 322n, or may temporarily store metadata (e.g., mapping tables) of the plurality of flash memory 3221 to 322n. The buffer memory 3240 may include volatile memory such as DRAM, SDRAM, DDR SDRAM, LPDDR SDRAM, or GRAM or nonvolatile memory such as FRAM, ReRAM, STT-MRAM, or PRAM.

Figure 22:
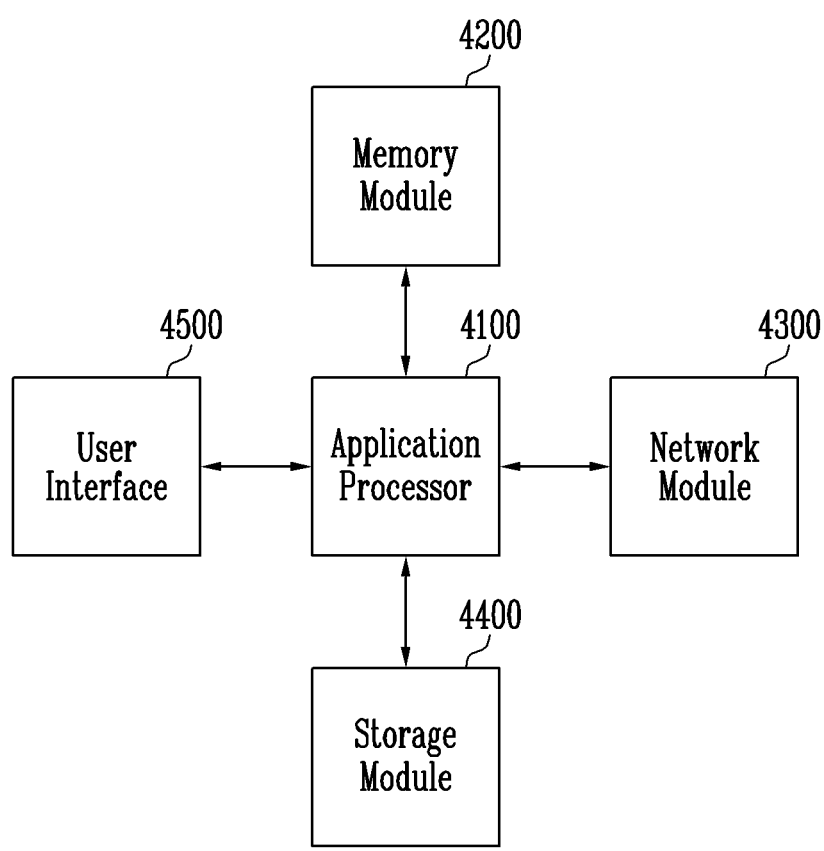
FIG. 22 is a block diagram illustrating a user system to which a storage device is applied according to an embodiment of the present disclosure.

FIG. 22 is a block diagram illustrating a user system 4000 to which a storage device is applied according to an embodiment of the present disclosure.

Referring to FIG. 22, the user system 4000 may include an application processor 4100, a memory module 4200, a network module 4300, a storage module 4400, and a user interface 4500.

The application processor 4100 may run components included in the user system 4000, an Operating System (OS), or a user program. For example, the application processor 4100 may include controllers, interfaces, graphic engines, and the like, for controlling the components included in the user system 4000. The application processor 4100 may be provided as a System-on-Chip (SoC).

The memory module 4200 may function as main memory, operational memory, buffer memory, or cache memory of the user system 4000. The memory module 4200 may include volatile random access memory such as DRAM, SDRAM, DDR SDRAM, DDR2 SDRAM, DDR3 SDRAM, LPDDR SDARM, LPDDR2 SDRAM, and LPDDR3 SDRAM or nonvolatile random access memory such as PRAM, ReRAM, MRAM, and FRAM. For example, the application processor 4100 and the memory module 4200 may be packaged based on Package-on-Package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or Wi-Fi. For example, the network module 4300 may be included in the application processor 4100.

The storage module 4400 may store data. For example, the storage module 4400 may store data received from the application processor 4100. Alternatively, the storage module 4400 may transfer the data stored in the storage module 4400 to the application processor 4100. For example, the storage module 4400 may be embodied as a nonvolatile semiconductor memory device, such as Phase-change RAM (PRAM), Magnetic RAM (MRAM), Resistive RAM (RRAM), NAND flash memory, NOR flash memory, or NAND flash memory having a three-dimensional (3D) structure. For example, the storage module 4400 may be provided as a removable storage medium (i.e., removable drive), such as a memory card or an external drive of the user system 4000.

For example, the storage module 4400 may include a plurality of nonvolatile memory devices, each of which may operate in the same manner as the memory device described above with reference to FIGS. 2 and 3. The storage module 4400 may operate in the same manner as the storage device 50 described above with reference to FIG. 1.

The user interface 4500 may include interfaces which input data or commands to the application processor 4100 or output data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

According to embodiments of the present disclosure, a voltage level of a bit line may reach a target level by setting a time for which a signal is applied to a transistor coupled, through the bit line, to a memory cell on which a double verify program operation is performed based on a state of memory cells adjacent to the memory cell on which the double verify program operation is performed and/or the number of program loops that have already been performed.

While the present invention has been illustrated and described in connection with various embodiments, those skilled in the art will recognize in view of the present disclosure that various modifications may be made to any of the disclosed embodiments within the spirit and scope of the invention. The present invention encompasses all such modifications that fall with the scope of the claims.

What is claimed is:

1. A memory device, comprising:
   a plurality of memory cells;
   a peripheral circuit configured to perform a plurality of program loops for programming selected memory cells among the plurality of memory cells; and
   a sense signal controller configured to determine, during a program operation on a first memory cell among the selected memory cells, a bit line set-up time of a bit line coupled to the first memory cell based on at least one of a state of second memory cells adjacent to the first memory cell and a number of program loops performed on the first memory cell, the first memory cell having a threshold voltage higher than a pre-verify voltage and lower than a main verify voltage.

2. The memory device of claim 1, wherein the bit line set-up time represents a time during which a signal is applied to a gate of a transistor coupled to the first memory cell through the bit line.

3. The memory device of claim 1, wherein a threshold voltage of each of the second memory cells is one of lower than the pre-verify voltage, higher than the pre-verify voltage and lower than the main verify voltage, and higher than the main verify voltage.

4. The memory device of claim 3, wherein the sense signal controller sets the bit line set-up time to a time that is longer than a reference time by a first offset time when a number of memory cells each having the threshold voltage lower than the pre-verify voltage, among the second memory cells, exceeds a reference number.

5. The memory device of claim 4, wherein the sense signal controller sets the bit line set-up time to a time that is longer than the reference time by a second offset time when the number of memory cells each having the threshold voltage lower than the pre-verify voltage, among the second memory cells, is less than or equal to the reference number.

6. The memory device of claim 5, wherein the first offset time is longer than the second offset time.

7. The memory device of claim 1, wherein the sense signal controller corrects the set bit line set-up time based on the number of program loops performed on the first memory cell after the bit line set-up time is set based on the state of the second memory cells.

8. The memory device of claim 7, wherein the sense signal controller is configured to:
correct the set bit line set-up time to a time obtained by adding a third offset time to the set bit line set-up time when the number of program loops performed on the first memory cell is less than or equal to a set number; and
correct the set bit line set-up time to a time obtained by adding a fourth offset time to the set bit line set-up time when the number of program loops performed on the first memory cell exceeds the set number.

9. The memory device of claim 8, wherein the third offset time is longer than the fourth offset time.

10. The memory device of claim 1, wherein the sense signal controller sets the bit line set-up time to a time that is longer than a reference time by a fifth offset time when the number of program loops performed on the first memory cell is less than or equal to a reference number.

11. The memory device of claim 10, wherein the sense signal controller sets the bit line set-up time to a time that is longer than the reference time by a sixth offset time when the number of program loops performed on the first memory cell exceeds the reference number.

12. The memory device of claim 11, wherein the fifth offset time is longer than the sixth offset time.

13. The memory device of claim 1, wherein the sense signal controller corrects the set bit line set-up time based on the state of the second memory cells after the bit line set-up time is set based on the number of program loops performed on the first memory cell.

14. The memory device of claim 13, wherein the sense signal controller is configured to:
correct the set bit line set-up time to a time obtained by adding a seventh offset time to the set bit line set-up time when a number of memory cells each having a threshold voltage lower than the pre-verify voltage, among the second memory cells, exceeds a reference number; and
correct the set bit line set-up time to a time obtained by adding an eighth offset time to the set bit line set-up time when the number of memory cells each having the threshold voltage lower than the pre-verify voltage, among the second memory cells, is less than or equal to the reference number.

15. The memory device of claim 14, wherein the seventh offset time is longer than the eighth offset time.

16. A method of operating a memory device including a plurality of memory cells, the method comprising:
performing a plurality of program loops for programming selected memory cells among the plurality of memory cells; and
determining a bit line set-up time of a bit line coupled to a first memory cell, among the selected memory cells, during a program operation on the first memory cell, based on at least one of a state of second memory cells adjacent to the first memory cell and a number of program loops performed on the first memory cell, the first memory cell having a threshold voltage higher than a pre-verify voltage and lower than a main verify voltage.

17. The method of claim 16, wherein a threshold voltage of each the second memory cells is one of lower than the pre-verify voltage, higher than the pre-verify voltage and lower than the main verify voltage, and higher than the main verify voltage.

18. The method of claim 17, wherein the bit line set-up time is set to a time that is longer than a reference time by a first offset time when a number of memory cells each having the threshold voltage lower than the pre-verify voltage, among the second memory cells, exceeds a reference number, and
wherein the bit line set-up time is set to a time that is longer than the reference time by a second offset time when the number of memory cells each having the threshold voltage lower than the pre-verify voltage, among the second memory cells, is less than or equal to the reference number.

19. The method of claim 18, wherein the first offset time is longer than the second offset time.

20. A memory device comprising:
a plurality of memory cells arranged at intersections of a plurality of word lines extending in one direction and a plurality of bit lines extending in another direction;
a voltage generator coupled to the plurality of word lines; and
control logic configured to perform a program operation, including a plurality of program loops, on a target memory cell coupled to a target bit line and a word line to which memory cells adjacent to the target memory cell are also coupled, each adjacent memory cell also being coupled to a corresponding adjacent bit line,
wherein the control logic includes a sense controller configured to control the voltage generator to:
provide, to the word line, a ground voltage in a first period, a pass voltage in a second period after the first period, and a program voltage in a third period after the second period; and
provide, to each of the target and adjacent bit lines, a sense signal to set up each of the target and adjacent bit lines in an initial time segment of the third period,
wherein the initial time segment is adjusted based on states of the adjacent memory cells and the number of program loops performed.

* * * * *